US 10,644,229 B2

(12) United States Patent
Hsu

(10) Patent No.: US 10,644,229 B2
(45) Date of Patent: May 5, 2020

(54) MAGNETORESISTIVE RANDOM ACCESS MEMORY CELL AND FABRICATING THE SAME

(71) Applicant: Taiwan Semiconductor Manufacturing Company, Ltd., Hsin-Chu (TW)

(72) Inventor: Chern-Yow Hsu, Hsin-Chu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 481 days.

(21) Appl. No.: 14/858,054

(22) Filed: Sep. 18, 2015

(65) Prior Publication Data

US 2017/0084828 A1 Mar. 23, 2017

(51) Int. Cl.
*H01L 43/12* (2006.01)
*H01L 43/08* (2006.01)
*G11C 11/16* (2006.01)
*H01L 27/22* (2006.01)

(52) U.S. Cl.
CPC .......... *H01L 43/12* (2013.01); *G11C 11/16* (2013.01); *H01L 43/08* (2013.01); *H01L 27/228* (2013.01)

(58) Field of Classification Search
CPC ....... H01L 43/08; H01L 43/12; H01L 27/228; G11C 11/16
See application file for complete search history.

(56) References Cited

U.S. PATENT DOCUMENTS

| 6,897,532 B1 * | 5/2005 | Schwarz ............... B82Y 25/00 257/367 |
| 7,564,115 B2 | 7/2009 | Chen et al. |
| 7,633,165 B2 | 12/2009 | Hsu et al. |
| 7,825,024 B2 | 11/2010 | Lin et al. |
| 7,973,413 B2 | 7/2011 | Kuo et al. |
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |

(Continued)

OTHER PUBLICATIONS

Chern-Yow Hsu et al., U.S. Appl. No. 14/608,313, filed Jan. 29, 2015, for "Self-Aligned Magnetoresistive Random-Access Memory (MRAM) Structure for Process Damage Minimization", 21 pages of text, 8 pages of drawings.

*Primary Examiner* — Marcos D. Pizarro
(74) *Attorney, Agent, or Firm* — Haynes and Boone, LLP

(57) ABSTRACT

A method of fabricating a semiconductor device includes forming a stack of film comprising an anti-ferromagnetic layer, the pin layer, a barrier layer, a free layer and a bottom electrode layer. The method also includes forming a first patterned hard mask over the anti-ferromagnetic layer, etching the anti-ferromagnetic layer and the pin layer by using the first patterned hard mask as a first etch mask, forming a first capping layer along sidewalls of the anti-ferromagnetic layer and the pin layer, etching the barrier layer and the free layer by using first patterned hard mask and the first capping layer as a second etch mask, forming a second capping layer over the first capping layer and extending along sidewalls of the barrier layer and the free layer, exposing the anti-ferromagnetic layer and forming a top electrode layer over the exposed anti-ferromagnetic layer.

20 Claims, 29 Drawing Sheets

(56) References Cited

U.S. PATENT DOCUMENTS

| | | |
|---|---|---|
| 8,227,902 B2 | 7/2012 | Kuo |
| 8,278,152 B2 | 10/2012 | Liu et al. |
| 8,426,961 B2 | 4/2013 | Shih et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 2014/0001645 A1 | 1/2014 | Lin et al. |
| 2014/0197504 A1* | 7/2014 | Moriyama ............ G11C 11/161 257/421 |
| 2014/0225258 A1 | 8/2014 | Chiu et al. |
| 2014/0252572 A1 | 9/2014 | Hou et al. |

* cited by examiner

US 10,644,229 B2

MAGNETORESISTIVE RANDOM ACCESS MEMORY CELL AND FABRICATING THE SAME

BACKGROUND

In integrated circuit (IC) devices, magnetoresistive random access memory (MRAM) is an emerging technology for next generation embedded memory devices. MRAM is a memory device including an array of MRAM cells, each of which stores a bit of data using resistance values, rather than electronic charge. Each MRAM cell includes a magnetic tunnel junction ("MTJ") cell, the resistance of which can be adjusted to represent logic "0" or logic "1". The MTJ includes a stack of films. The MTJ cell is coupled between top and bottom electrodes and an electric current flowing through the MTJ cell from one electrode to the other may be detected to determine the resistance, and therefore the logic state. However, various damages to the MTJ cell, including damage on sidewalls of the stack of films during etching processes in the fabrication, result in decreased performance of the MTJ cell. Accordingly, it would be desirable to provide an improved MRAM structure and method of manufacturing thereof.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
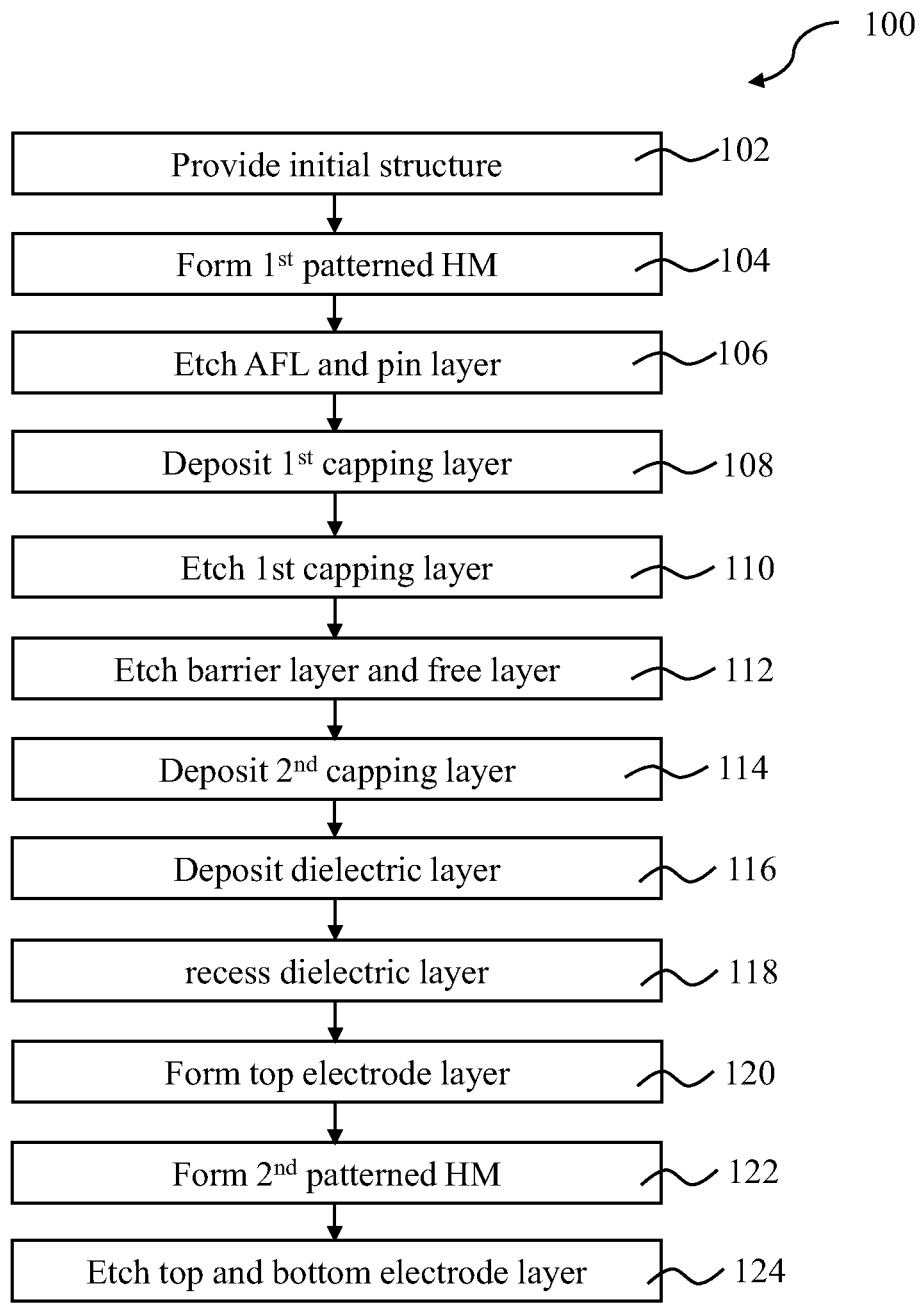
FIG. 1 is a flowchart of an example method for fabricating a MRAM cell constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a flowchart 100 of fabricating one or more MRAM cells in accordance with some embodiments. The method 100 is discussed in detail below, with reference to an initial structure 205 of a MRAM cell showed in FIG. 2. FIGS. 3, 4, 5, 6, 7, 8, 9, 10, 11, 12, 13A and 13B illustrate sectional views of the MRAM cell 200 during various fabrication stages and constructed according to various aspects of the present disclosure in one or more embodiments.

A MRAM cell includes a pair of electrode layers and a magnetic tunneling junction (MTJ) arranged between the electrode layers. The MTJ includes a pair of ferromagnetic layers, a barrier layer arranged between the ferromagnetic layers and an anti-ferromagnetic layer (AFL). The ferromagnetic layers include a pin layer and a free layer. The pin layer has a permanent or fixed magnetic polarity, typically pinned by an anti-ferromagnetic layer arranged between one of the electrode layers and the pin layer. The free layer has a variable magnetic polarity representing a unit of data, such as a bit of data.

In an operation, the variable magnetic polarity is typically read by measuring the resistance of the MTJ. Due to the magnetic tunnel effect, the resistance of the MTJ changes with the variable magnetic polarity. Further, in operation, the variable magnetic polarity is typically changed or toggled using the spin-transfer torque (STT) effect. According to the spin-transfer torque (STT) effect, current is passed across the MTJ to induce a flow of electrons from the pin layer to the free layer. As electrons pass through the pin layer, the spins of the electrons are polarized. When the spin-polarized electrons reach the free layer, the spin-polarized electrons apply a torque to the variable magnetic polarity and toggle the state of the variable magnetic polarity.

According to some methods for manufacturing an MRAM cell, a free layer, a barrier layer, a pin layer and an anti-ferromagnetic layer are stacked in that order over a bottom electrode layer. One or more plasma etches is then performed to the bottom electrode layer through regions of the anti-ferromagnetic layer, the pin layer, the barrier layer and the free layer surrounding a MTJ region of the stack. During these etch processes, one or more of these layers may experience process-induced adverse effects, such as plasma damage, and/or by-products (such as polymer) re-deposition, which may lead to increased leakage current and/or reduced data retention. In the present embodiment, the method 100 provides a scheme of preventing etch-process-induced damage.

FIG. 1 is a flowchart of a method 100 of fabricating one or more MRAM cells in accordance with some embodiments. The method 100 is discussed in detail below, with reference to an initial structure 205 of a MRAM cell 200 showed in FIG. 2 and the MRAM cell 200 shown in FIGS. 3, 4, 5, 6, 7, 8, 9, 10, 11, 12, 13A and 13B.

Figure 2:
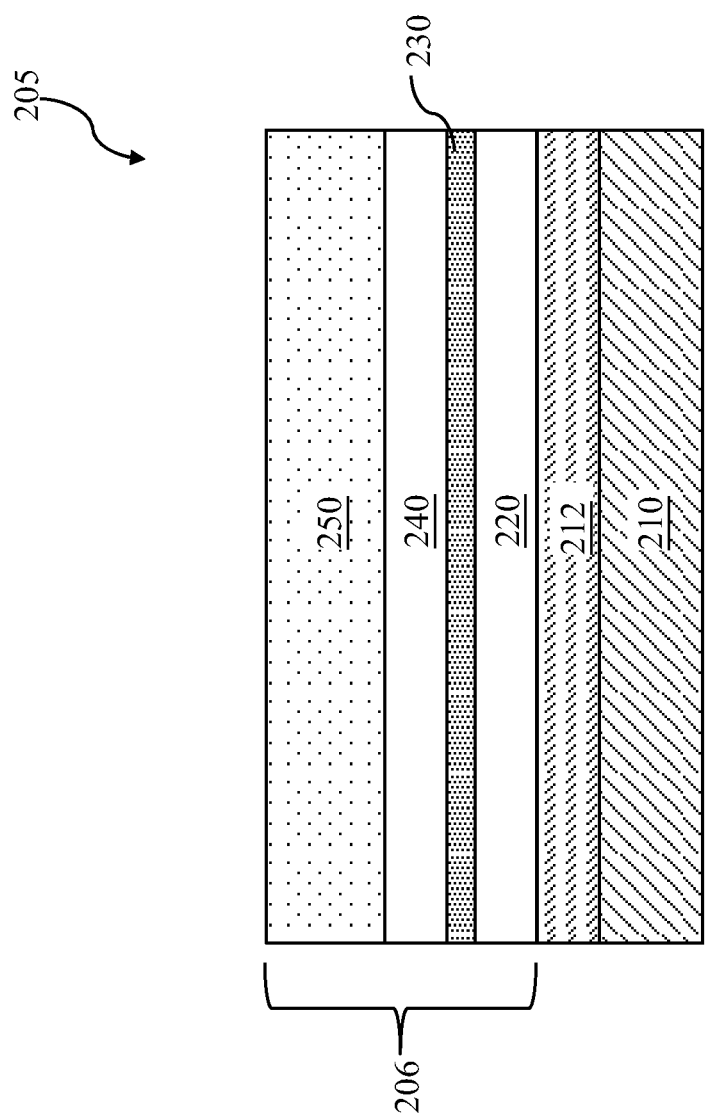
FIGS. 2, 3, 4, 5, 6, 7, 8, 9, 10, 11, 12, 13A and 13B are cross-sectional views of an exemplary MRAM cell in accordance with some embodiments.

Referring to FIGS. 1 and 2, the method 100 starts at step 102 by providing the initial structure 205 of a MRAM cell 200. The initial structure 205 may include a bottom electrode layer 212 disposed over a substrate 210. The substrate 210 may include layers, features of an integrated circuit, such as an etch-stop layer and vias, which will be described later. The bottom electrode layer 212 may include titanium (Ti), tantalum (Ta), platinum (Pt), ruthenium (Ru), titanium nitride (TiN), tantalum nitride (TaN), and/or other suitable materials. In one embodiment, the bottom electrode layer 212 has a thickness ranging from about 10 nm to about 100 nm.

The initial structure 205 also includes a stack of films 206 over the bottom electrode layer 212. The stack of films 206 includes a free layer 220 disposed over a bottom electrode layer 212. The free layer 220 may include a ferromagnetic material but it is not pinned because there is no anti-ferromagnetic material adjacent to the free layer 220. Therefore, the magnetic orientation of the layer 220 is free, thus referred to as a free layer. The free layer 220 has a variable magnetic polarity representing a unit of data. For example, the variable magnetic polarity switches between a first state and a second state that respectively represent a binary "0" and a binary "1". The free layer 220 may include cobalt (Co), iron (Fe), boron cobalt-iron-boron (CoFeB), cobalt-iron-tantalum (CoFeTa), nickel iron (NiFe), cobalt iron (CoFe), cobalt platinum (CoPt), cobalt palladium (CoPd), iron platinum (FePt), or the alloy of Ni, Co and Fe. In one embodiment, the free layer 220 has a thickness ranging from about 1 nm to about 3 nm.

The stack of films 206 also includes a barrier layer 230 disposed over the free layer 220. The barrier layer 230 provides electrical isolation between the free layer 220 and a pin layer to be formed over the barrier layer 230, while still allowing electrons to tunnel through under proper conditions. The material of the barrier layer 230 is also chosen in such that it has an adequate etching resistance in a subsequent etching which will be described details later. The barrier layer 230 may include a metal-oxide and/or metal-nitride layer. The metal in the metal-oxide (or metal-nitride) barrier layer includes magnesium (Mg), beryllium (Be), aluminium (Al), Ti, tungsten (W), germanium (Ge), Pt and/or their alloy. In one embodiment, the barrier layer 230 has a thickness ranging from about 0.5 nm to about 2 nm.

The stack of films 206 also includes a pin layer 240 disposed over the barrier layer 230. The pin layer 240 may include a ferromagnetic material similar to the ferromagnetic material used in the free layer 220, such as Co, Fe, CoFeBRu, CoFeTa, CoFeB, NiFe, Co, CoFe, CoPt, CoPd, FePt, or the alloy of Ni, Co and Fe. In one embodiment, the pin layer 240 has a thickness ranging from about 5 nm to about 10 nm.

The pin layer 240 may also include a multilayer structure. In one embodiment, the pin layer 240 includes a first pinned layer (or bottom pin layer) and a second pinned layer (or top pin layer) interposed by a spacer layer. In this embodiment, the bottom pin layer includes a ferromagnetic material disposed over the barrier layer 230. The spacer layer may include Ru, Ti, Ta, Cu, and/or Ag, disposed over the bottom pin layer. The top pin layer may include a ferromagnetic material layer substantially similar to that of the bottom pin layer, disposed on the spacer layer.

The stack of films 206 also includes an anti-ferromagnetic layer (AFL) 250 disposed over the pin layer 240. In an anti-ferromagnetic material, the magnetic moments of atoms or molecules align in a regular pattern with neighboring spins pointing in opposite directions. The anti-ferromagnetic layer 250 pins the pin layer 240 to a permanent or fixed magnetic polarity. The anti-ferromagnetic layer 250 may include platinum manganese (PtMn), iridium manganese (IrMn), rhodium manganese (RhMn), and/or iron manganese (FeMn). In one embodiment, the anti-ferromagnetic layer 250 has a thickness ranging from about 5 nm to about 20 nm.

One or more of layers 212, 220, 230, 240 and 250 may be formed by various methods, including physical vapor deposition (PVD) process, a chemical vapor deposition (CVD) process, ion beam deposition, spin-on coating, metal-organic decomposition (MOD), atomic layer deposition (ALD), and/or other methods known in the art.

Figure 3:
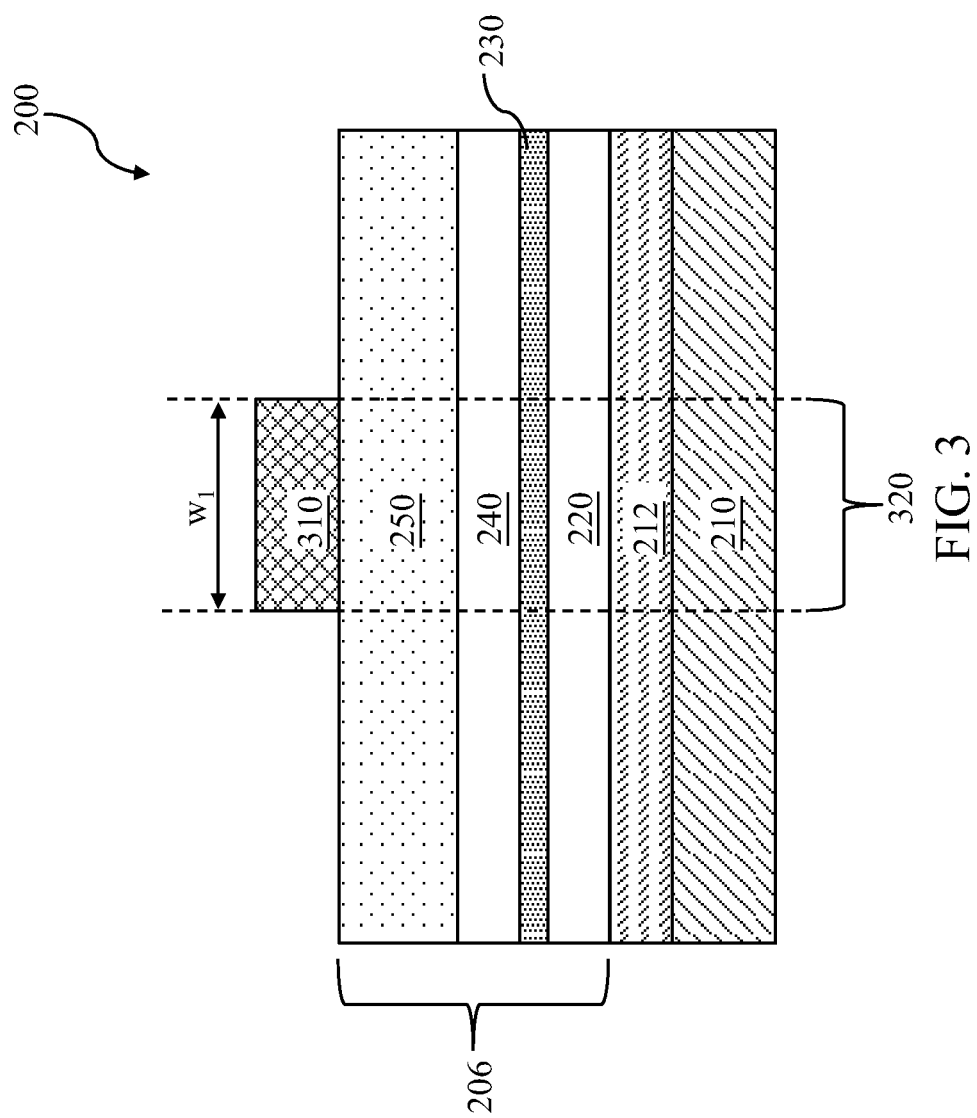

Referring to FIGS. 1 and 3, once the initial structure 205 is received, the method of 100 proceeds to step 104 by forming a first patterned hard mask (HM) layer 310 over the anti-ferromagnetic layer 250. The first patterned HM layer 310 defines (covers) a MTJ region 320 having a first width $w_1$ and exposes rest portions for a subsequent etch. In one embodiment, the first patterned HM 310 is a patterned photoresist layer formed by a procedure including coating, exposure, post exposure baking, and developing. In another embodiment, the first patterned HM 310 is formed by depositing a HM layer over the anti-ferromagnetic layer 250, depositing photoresist layer over the HM layer, patterning the photoresist layer, and then etching the HM layer through patterned photoresist layer to pattern the HM layer. The HM layer may include oxide, silicon nitride, and/or other suitable material, deposited by CVD, PVD, spin-on coating, and/or other proper technique.

Figure 4:
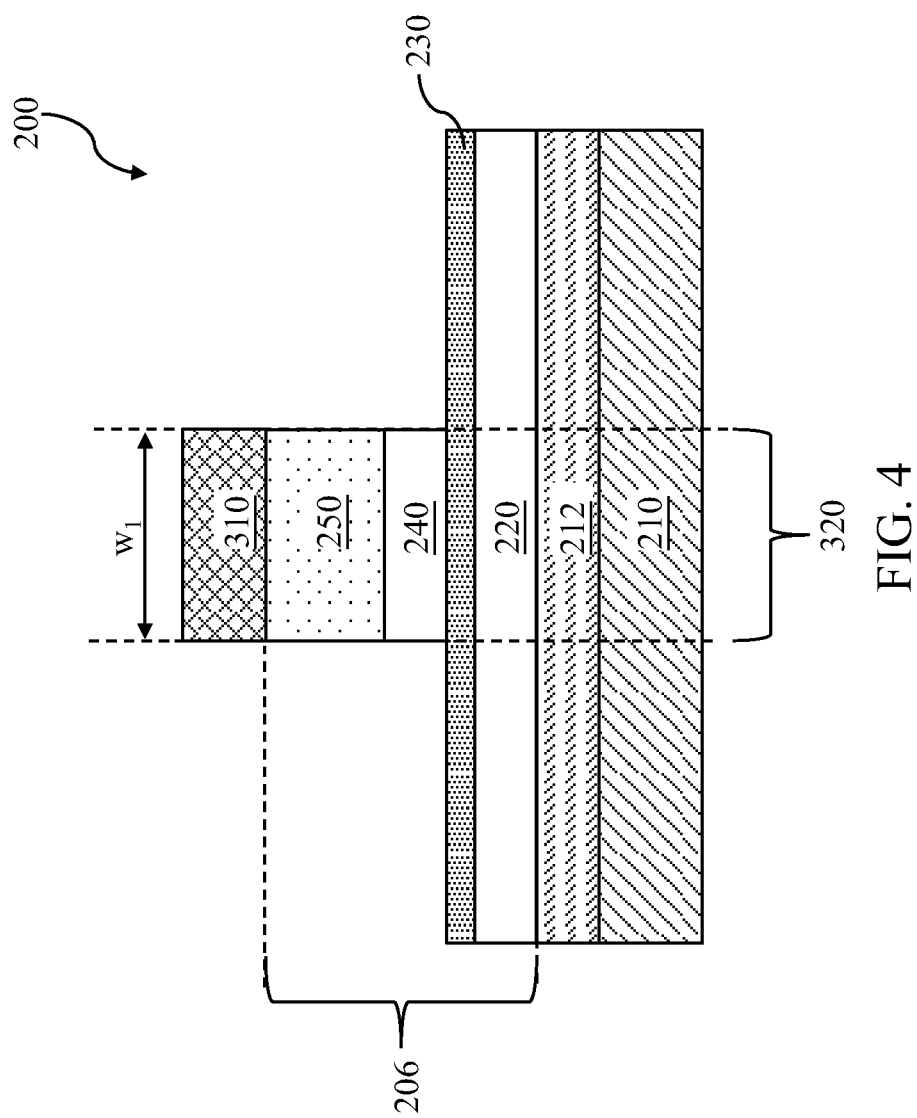

Referring to FIGS. 1 and 4, the method of 100 proceeds to step 106 by performing a first etch process to etch the anti-ferromagnetic layer 250 and the pin layer 240 by using the first patterned HM layer 310 as an etch mask. The first etch process may include a wet etch, a dry etch, and/or a combination thereof. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. The first etch process may include a multiple-step etching to gain etch selectivity, flexibility and desired etch profile. As has been mentioned previously, the first etch process is chosen to selectively etch the anti-ferromagnetic layer 250 and the pin layer 240 without substantially etching the barrier layer 230. Thus, the barrier layer 230 servers as an etch-stop layer to relax etch process constraints and improve the etch process window.

Figure 5:
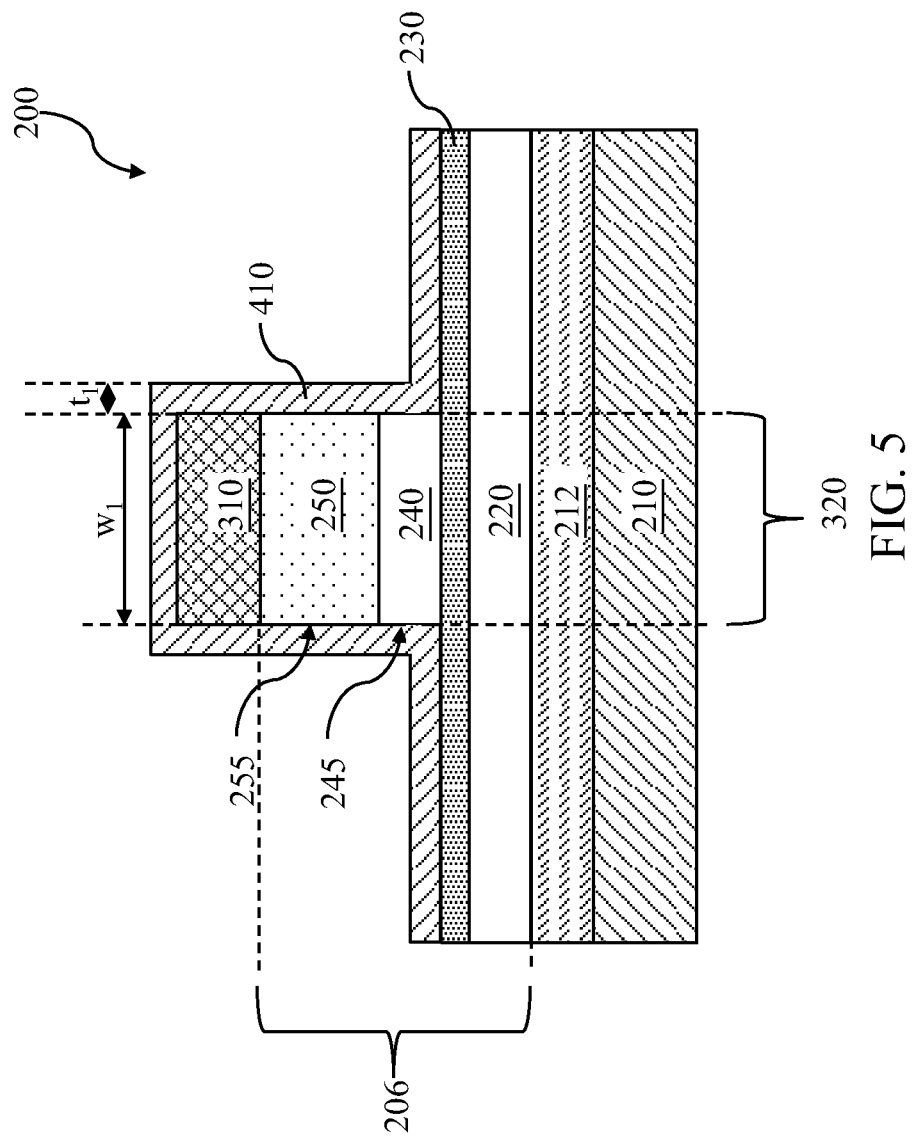

Referring to FIGS. 1 and 5, the method of 100 proceeds to step 108 by forming a first capping layer 410 over the first patterned HM layer 310, including conformably extending along sidewalls 255 of the anti-ferromagnetic layer 250 and sidewalls 245 of the pin layer 240. The first capping layer 410 may include silicon nitride, silicon carbide, and/or other suitable materials. The material of the first capping layer 410 is chosen in such that it has an adequate etching resistance in a subsequent etching as described below. The first capping layer 410 may be deposited by CVD, ALD, and/or other suitable process. In one embodiment, the first capping layer 410 along sidewalls of 245 and 255 is formed with a first thickness $t_1$ ranging from about 10 nm to about 50 nm to provide an adequate thickness to protect sidewalls 245 of the pin layer 240 and sidewalls 255 of the anti-ferromagnetic layer 250 during a subsequent etch process.

Figure 6:
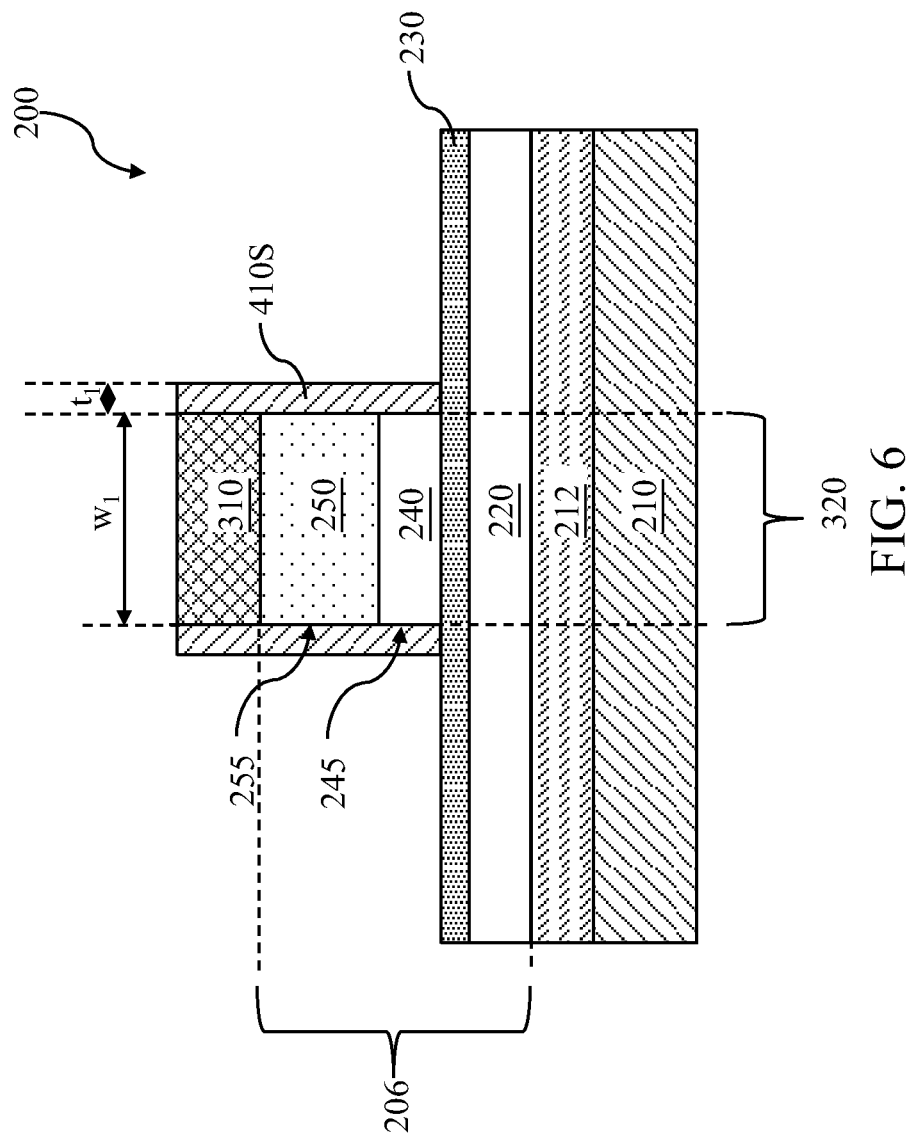

Referring to FIGS. 1 and 6, the method of 100 proceeds to step 110 by performing a second etch process to remove the first capping layer 410 from a top surface of the barrier layer 230 to expose the barrier layer 230 and from a top surface of the first patterned HM 310 to expose a top surface of first patterned HM 310. After the second etching, first capping layer 410 remains along sidewalls 245 and 255 and is referred to as a first sidewall-capping layer 410S. In the present embodiment, the second etch process may include an anisotropic dry etch process, which etches the first capping layer 410 disposed over the top surface the barrier layer 310 but not substantially etches the first sidewall-capping layer 410S. The second etch process may also include a selective anisotropic dry etch process, which is preferential of the first capping layer 410 relative to the first patterned HM 310 and the barrier layer 230. In one embodiment, the second etch process includes a plasma dry etching process using a fluorine-based chemistry, such as $CF_4$, $SF_6$, $CH_2F_2$, $CHF_3$, and/or $C_2F_6$ and other suitable gases.

Figure 7:
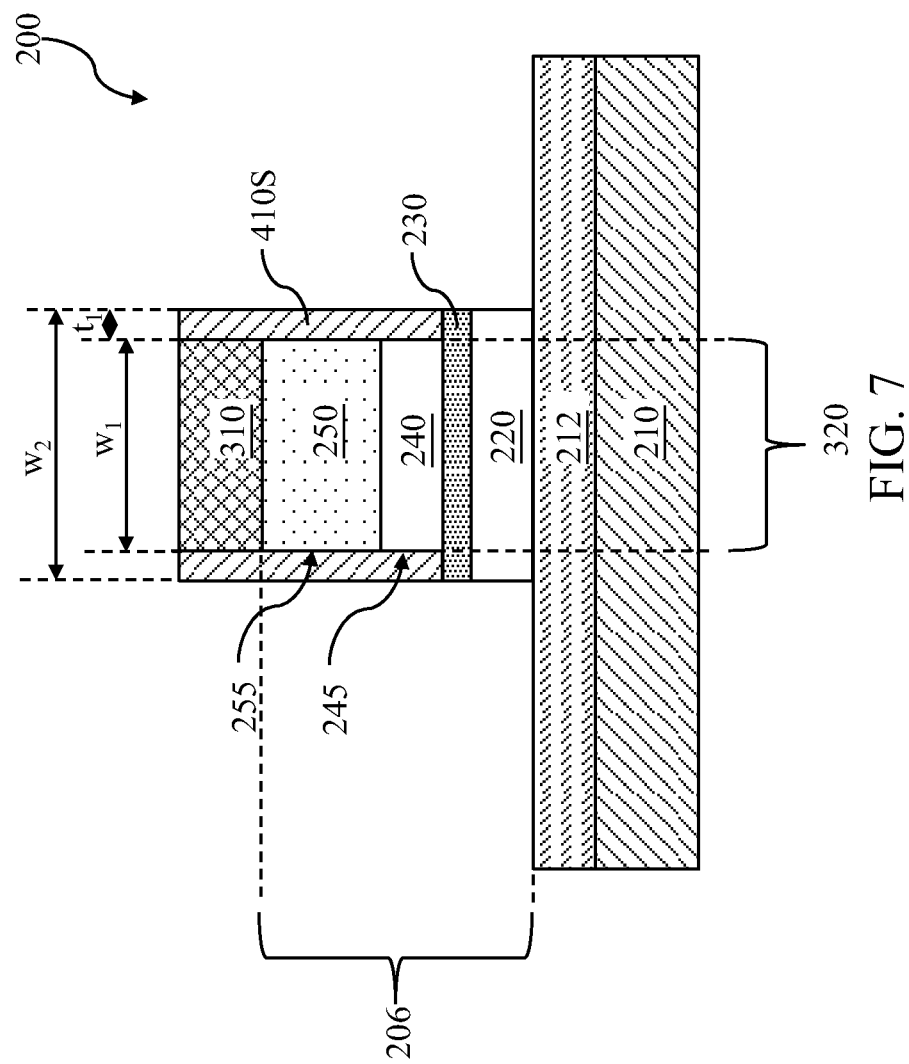

Referring to FIGS. 1 and 7, the method of 100 proceeds to step 112 by performing a third etch process to etch the exposed portions of barrier layer 230 and the free layer 220 by using the first patterned HM layer 310 and the first sidewall-capping layer 410S as an etch mask. As shown, the remaining free layer 220 has a second width $w_2$, which is wider than the first width $w_1$ of the remaining pin layer 240. An outer edge of the remaining pin free layer 220, and an outer edge of the barrier layer 230 align with an outer edge of the first sidewall-capping layer 410S. The etch process may include a wet etch, a dry etch, and/or a combination thereof. In the present embodiment, the third etch is a plasma etch process. As has been mentioned previously, the third etch process is chosen to selectively etch the barrier layer 230 and the free layer 220 without substantially etching the first patterned HM 310 and first sidewall-capping layer 410S. Thus, the first sidewall-capping layer 410S advantageously protects the sidewalls 255 of the etched anti-ferromagnetic layer 250 and sidewalls 245 of the pin layer 240 from exposing them in the third etch process. This reduces the likelihood of damage, and/or the re-deposition of by-product (such as polymer) on sidewalls 255 of the etched anti-ferromagnetic layer 250 and sidewalls 245 of the pin layer 240. As described above, such damage and/or re-deposition leads to increased leakage current and/or reduced data retention in a memory cell.

Figure 8:
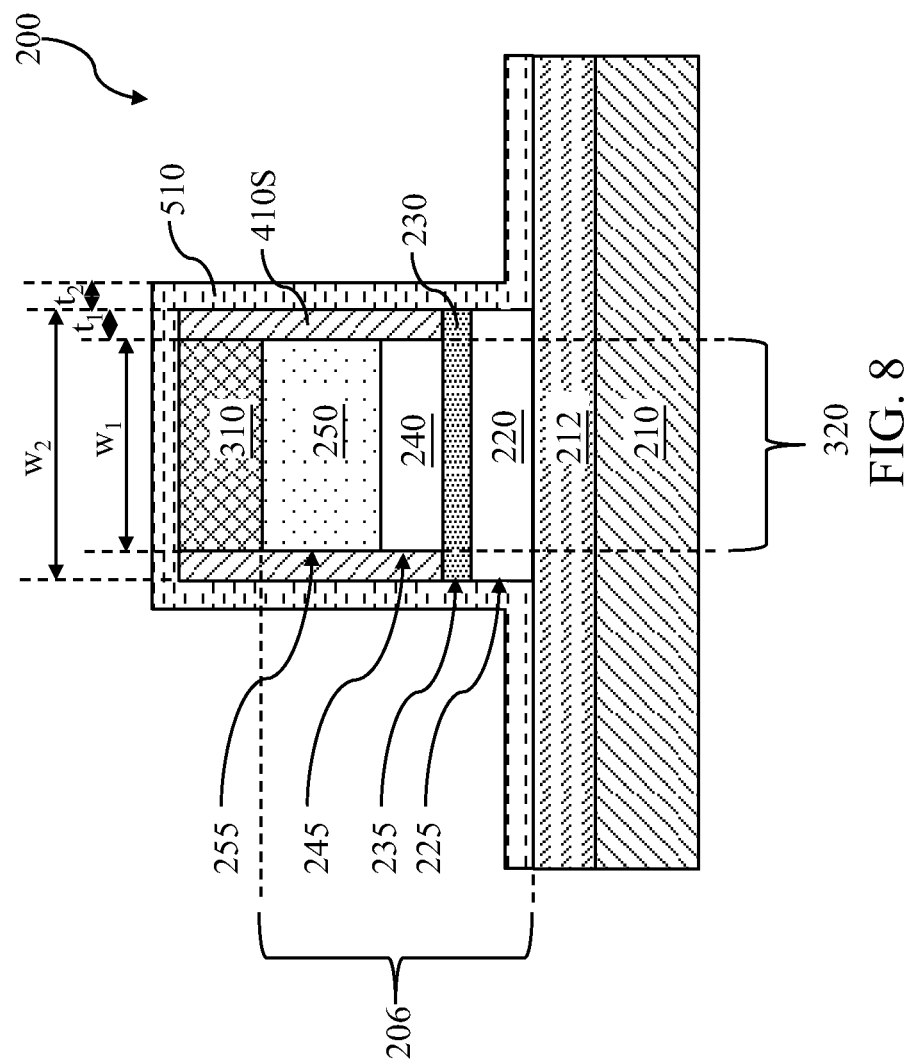

Referring to FIGS. 1 and 8, the method of 100 proceeds to step 114 by forming a second capping layer 510 over the first patterned HM 310 and the first sidewall-capping layer 410S, including conformably extending along sidewalls 225 of the free layer 220, as well as sidewalls of the barrier layer 230. The second capping layer 510 is formed similarly in many respects with the first capping layer 410 discussed above in association with FIG. 5. In one embodiment, the second capping layer 510 along sidewalls 225 is formed with a second thickness $t_2$ ranging from about 10 nm to about 50 nm to provide an adequate thickness to protect sidewalls 225 of the free layer 220 and sidewalls 235 of the barrier layer 230 during a subsequent etch process.

Figure 9:
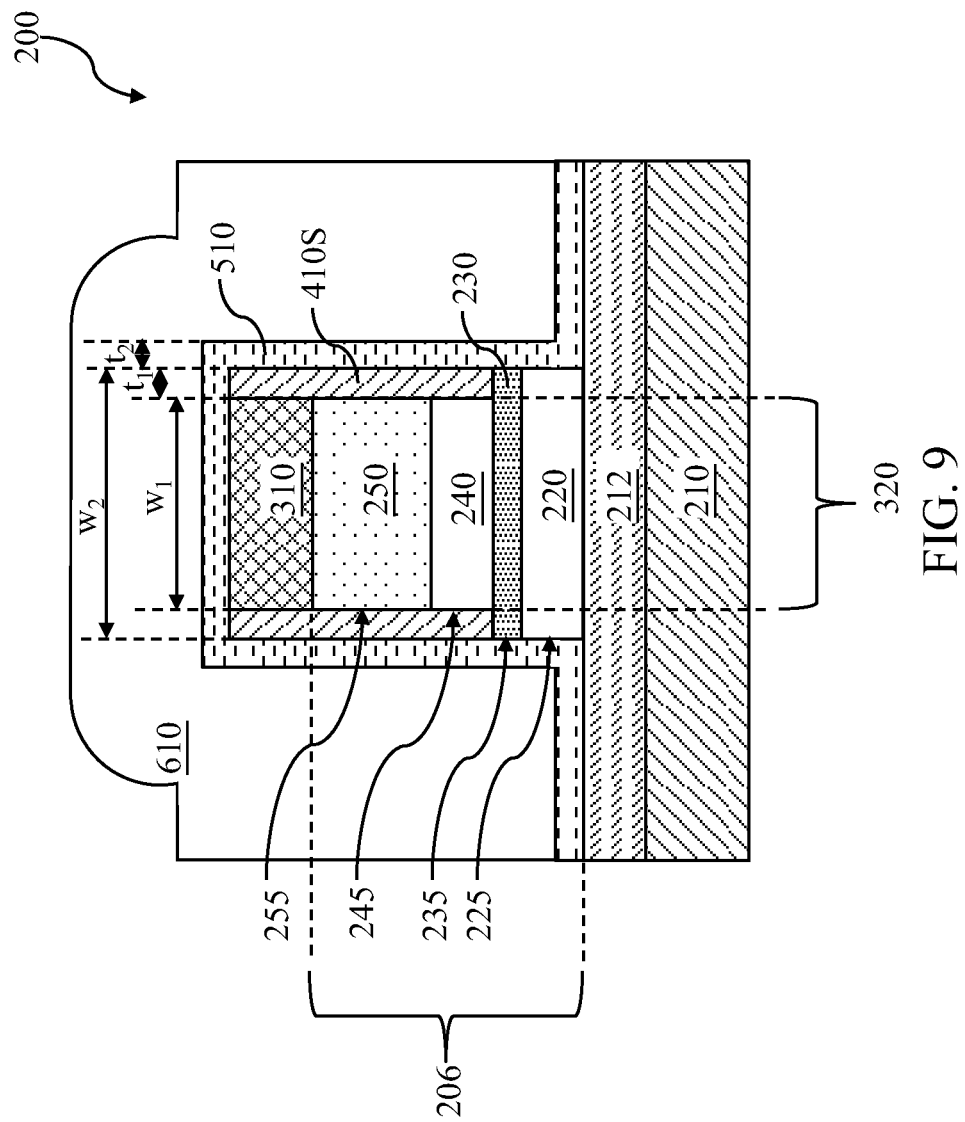

Referring to FIGS. 1 and 9, the method of 100 proceeds to step 116 by depositing a first dielectric layer 610 over the second capping layer 510 and filling up spaces around the MTJ region 320. The first dielectric layer 610 may include silicon oxide, silicon nitride, a dielectric material layer having a dielectric constant (k) lower than thermal silicon oxide (therefore referred to as low-k dielectric material layer), and/or other suitable dielectric material layer. The first dielectric layer 610 may be deposited by CVD, spin-on coating, and/or other suitable process.

Figure 10:
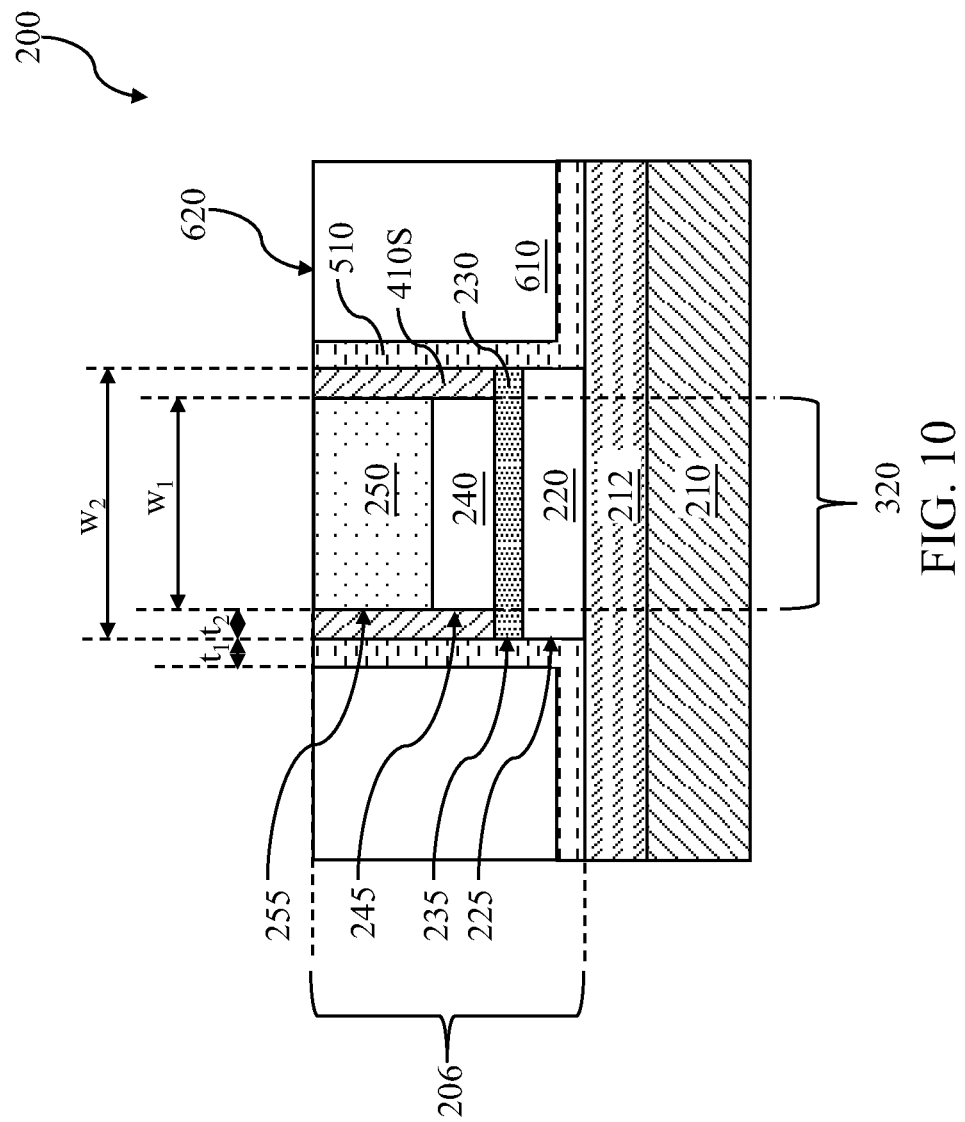

Referring to FIGS. 1 and 10, the method of 100 proceeds to step 118 by recessing the first dielectric layer 610, the second capping layers 510 disposed on top of the first patterned HM layer 310 and the first patterned HM 310 to expose a top surface of the anti-ferromagnetic layer 250. In some embodiments, a chemical mechanical polishing (CMP) is performed to recess (or planarize) the dielectric layer 610, the second the second capping layers 510 and the first patterned HM 310 to provide a planar topography, referred to as a surface 620, for subsequent processes, such as a top electrode layer deposition.

Figure 11:
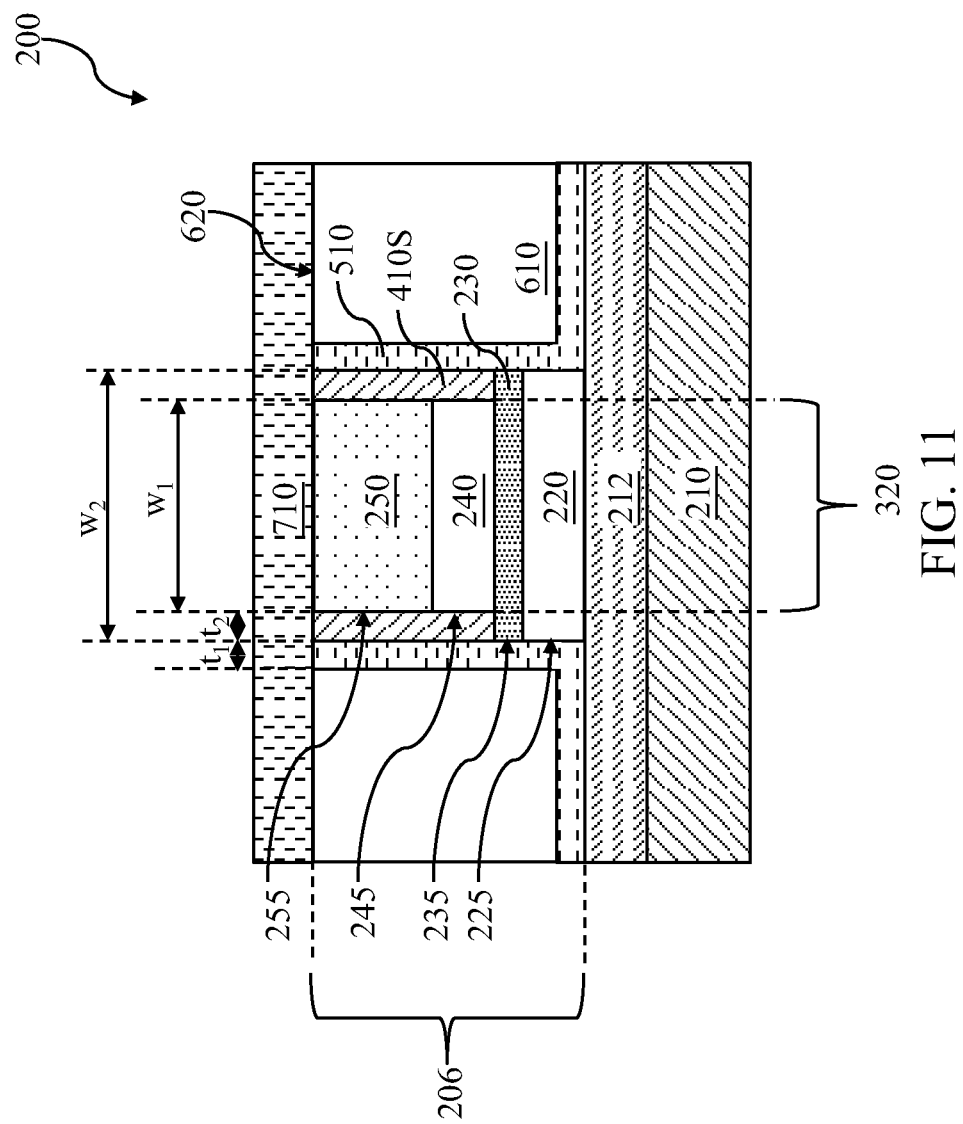

Referring to FIGS. 1 and 11, the method of 100 proceeds to step 120 by forming a top electrode layer 710 over the surface 620, including physical contacting with the anti-ferromagnetic layer 250. The top electrode layer 710 is formed similarly in many respects with the bottom electrode layer 212 discussed above in association with FIG. 2. In one embodiment, the top electrode layer 710 has a thickness ranging from about 10 nm to about 100 nm.

Figure 12:
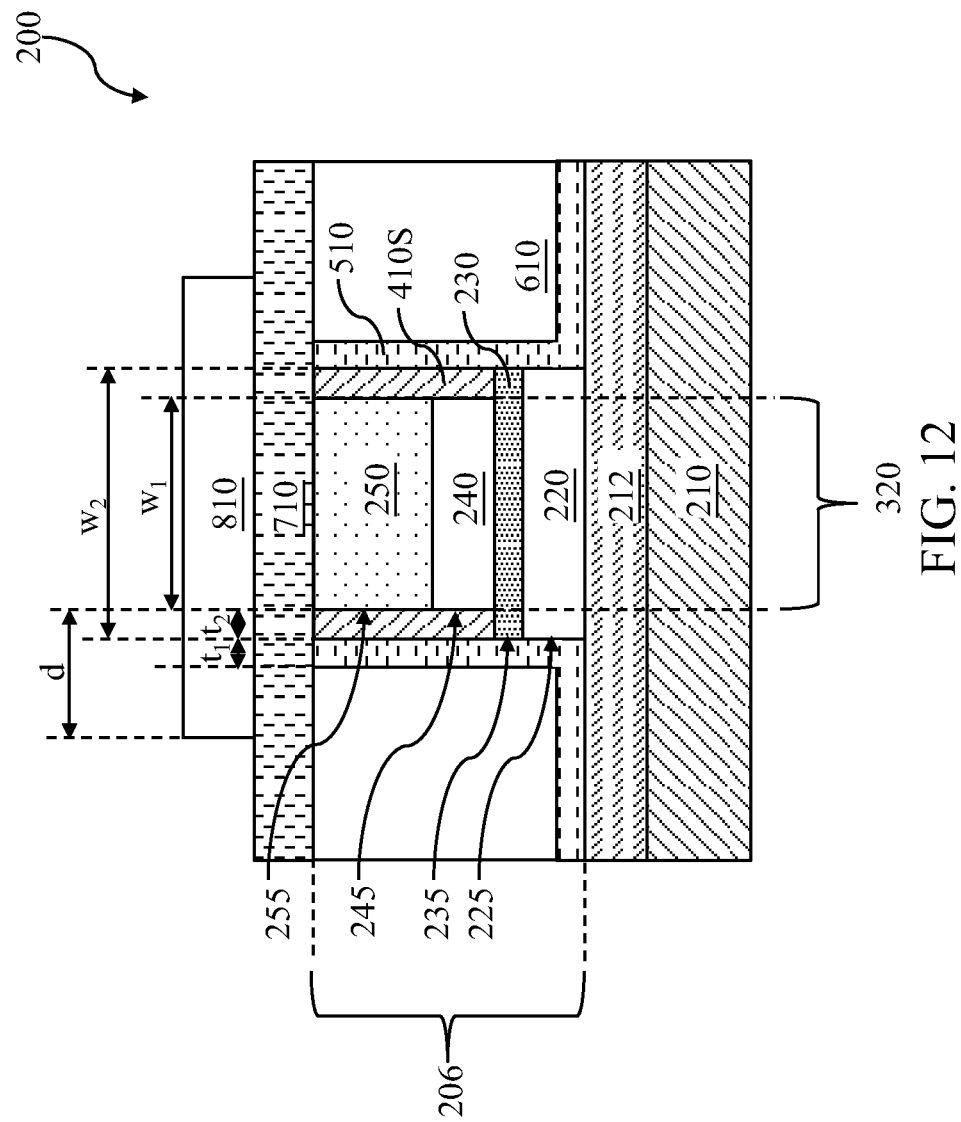

Referring to FIGS. 1 and 12, the method of 100 proceeds to step 122 by forming a second pattern HM 810 over the top electrode layer 710. The second patterned HM layer 810 defines (covers) a width of a top electrode to be formed. In the present embodiment, an edge of the second pattern HM 810 extends laterally beyond an edge of the anti-ferromagnetic layer 250 by a distance d. In one embodiment, the distance d ranges from about 10 nm to about 170 nm. The second patterned HM 810 similarly in many respects with the first patterned HM 310 discussed above in association with FIG. 3.

Figure 13A:
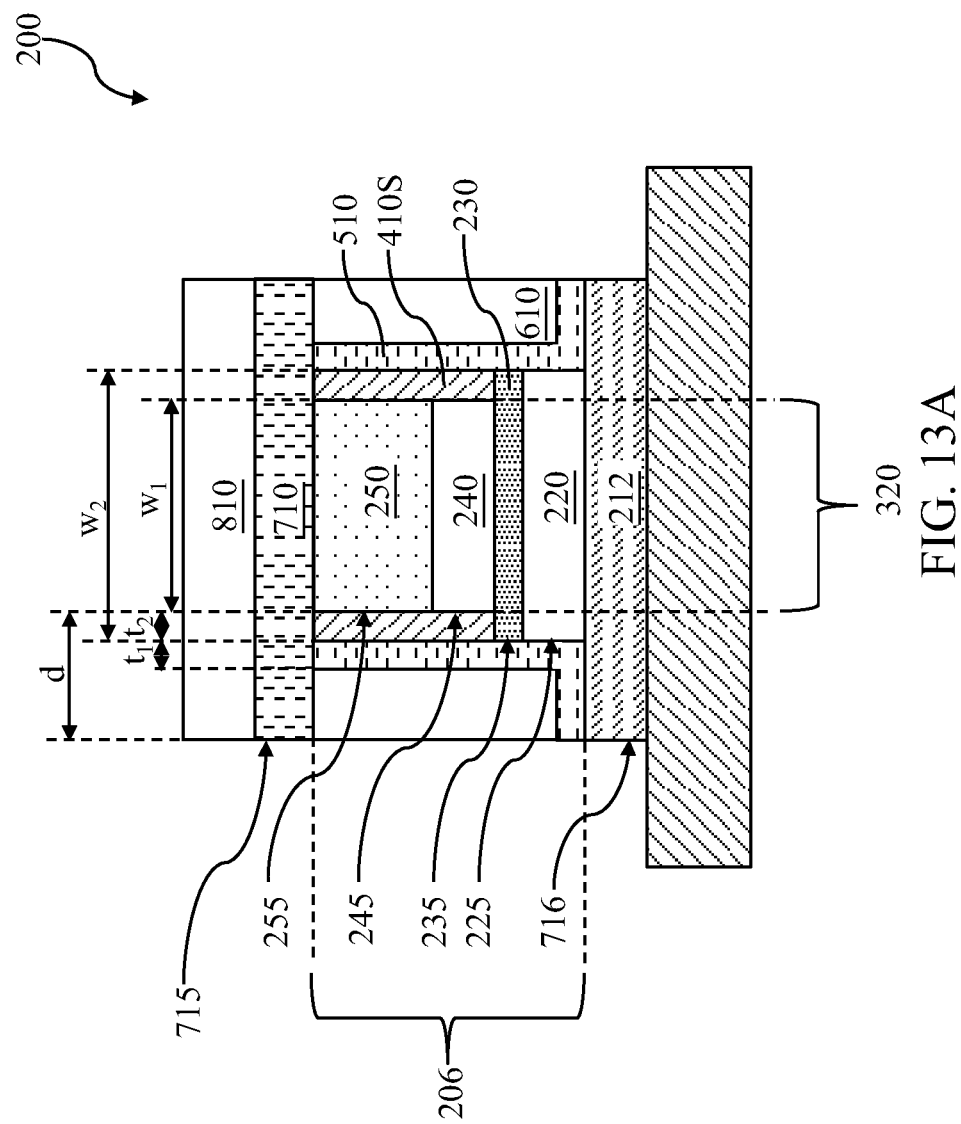

Referring to FIGS. 1 and 13A, the method of 100 proceeds to step 124 by performing a fourth etch process, using the second patterned HM 810 as an etch mask, to etch the top electrode layer 710 and the bottom electrode layer 212 to form a top electrode 715 and a bottom electrode 716, respectively. The first dielectric layer 610, the second capping layer 510 over the bottom electrode layer 212 are etched as well. The etch process may include a wet etch, a dry etch, and/or a combination thereof. In the present embodiment, the fourth etch is a plasma etch process. During the fourth etch process, sidewalls 225 are protected by the second capping layer 510 and sidewalls 245 and 255 are protected by the second capping layer 510 and the first sidewall-capping layer 410S. Thus, sidewalls of 225, 235, 245 and 255 advantageously avoid being exposed in the fourth etch process which reduces damage thereto, and/or the re-deposition of by-product (such as polymer) on them. As described above, such damage and/or re-deposition leads to increased leakage current and/or reduced data retention of the MRAM cell 200.

Figure 13B:
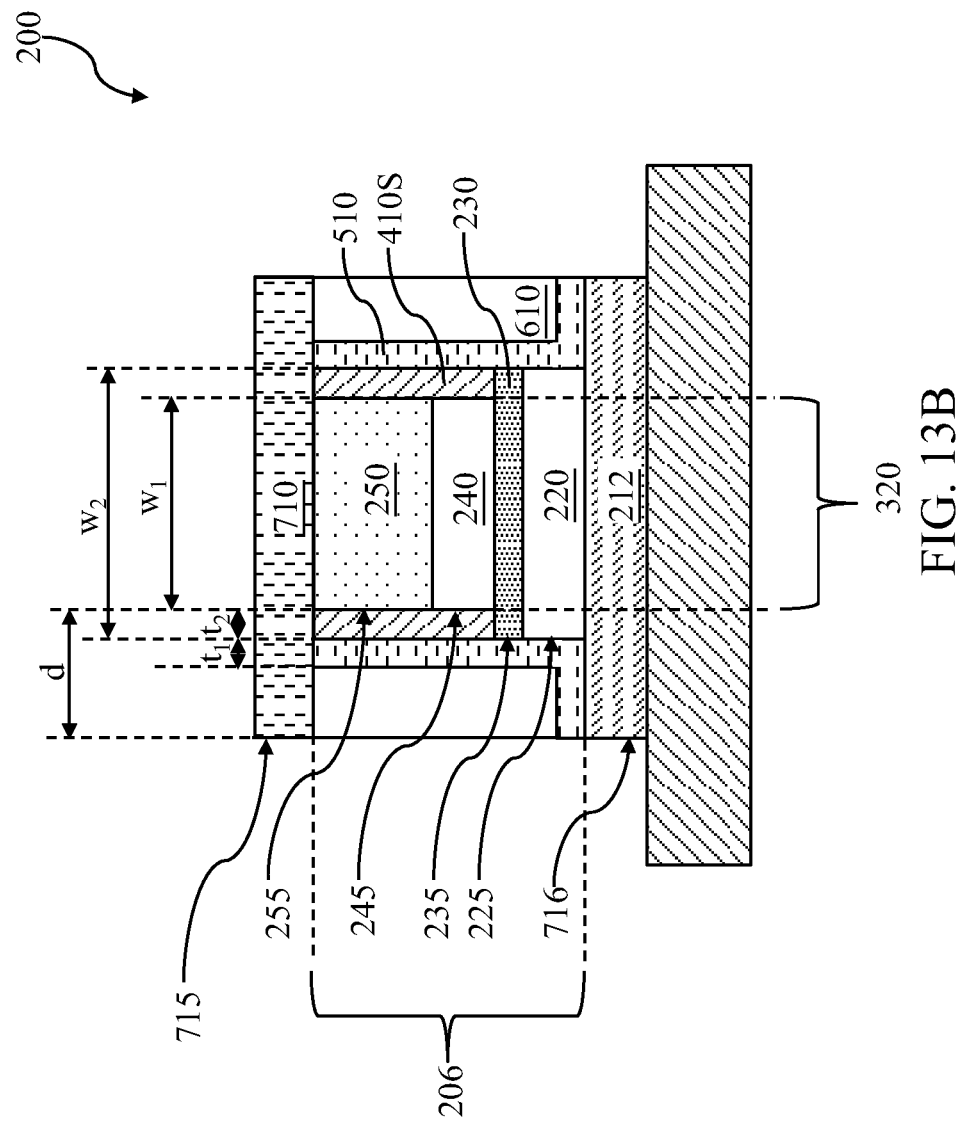

After the fourth etch process, the second patterned HM 810 is removed by an etch process, as shown in FIG. 13B. In the present embodiment, the MRAM cell 200 includes the bottom electrode 716, the free layer 220 disposed over the bottom electrode 716 and a barrier layer 230 disposed over the free layer 220. The free layer 220 and the barrier layer 230 have a same width, the second width $w_2$. The MRAM cell 200 also includes the pin layer 240 disposed over the barrier layer 230 and the anti-ferromagnetic layer 250 disposed over the pin layer 240. The pin layer 240, the anti-ferromagnetic layer 250 and the first top electrode 1205 have a same width, the first width $w_1$, which is smaller than the second width $w_2$.

The MRAM cell 2000 also includes the first sidewall-capping layer 410S extends along sidewalls 255 of the AFL 250 and sidewalls 245 of the pin layer 240. The second capping layer 510 disposed over the first sidewall-capping layer 410S and continue extends along sidewalls 235 of the barrier layer 230 and sidewalls 225 of the free layer 220. The MRAM cell 200 also includes the top electrode 715 disposed over the AFL 250. The top electrode 715 horizontally (or laterally) extends to outside of the anti-ferromagnetic layer 250 by the distance d. The bottom electrode 716 has a same width as the top electrode 715.

Figure 14:
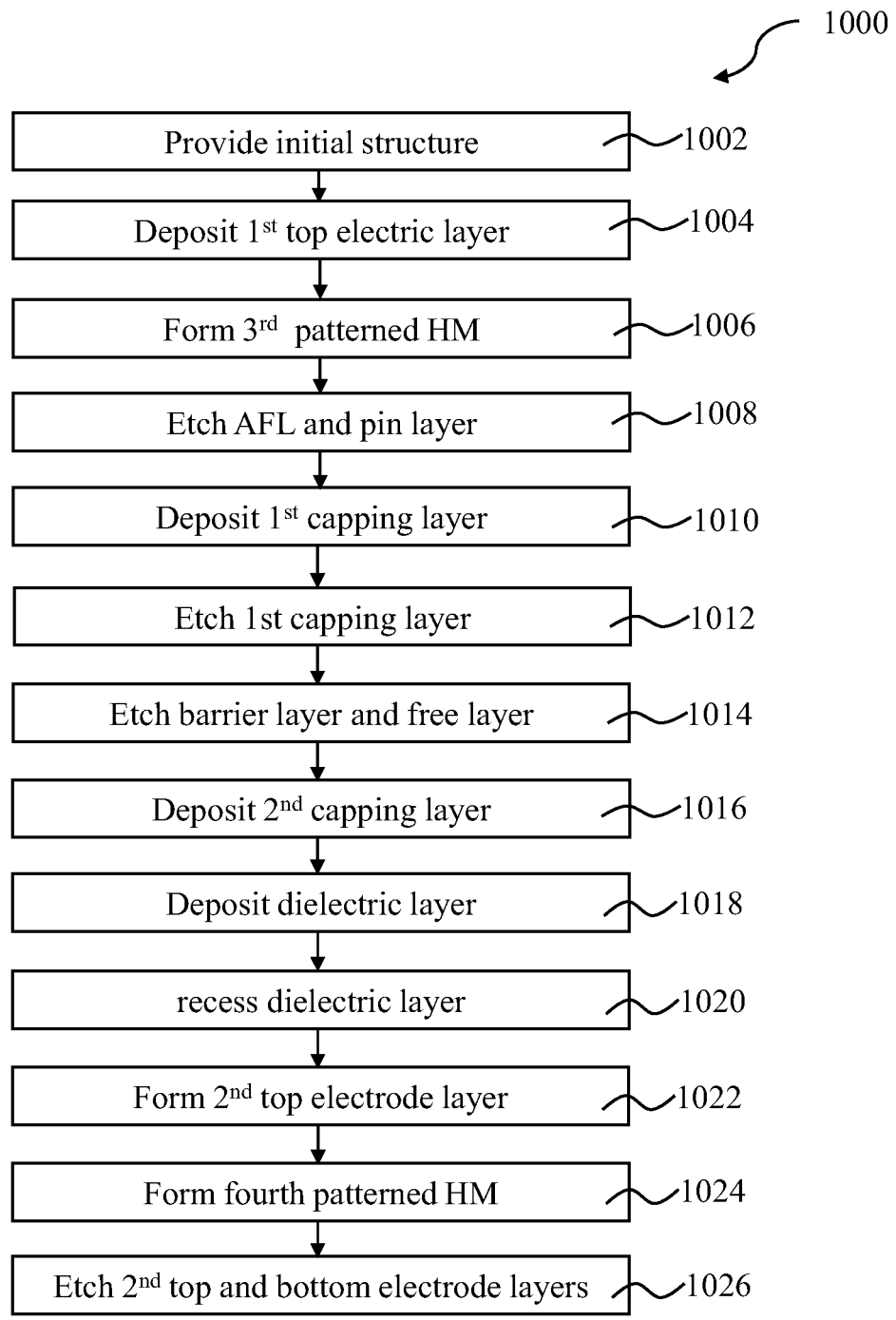
FIG. 14 is a flowchart of another example method for fabricating a MRAM cell constructed in accordance with some embodiments.

FIG. 14 is a flowchart of another example method 1000 for fabricating a MRAM cell 2000. The step 1002 is similar to those discussed above in steps 102 of method 100. Thus, the discussion above with respect to steps 102 is applicable to the steps 1002. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 15:
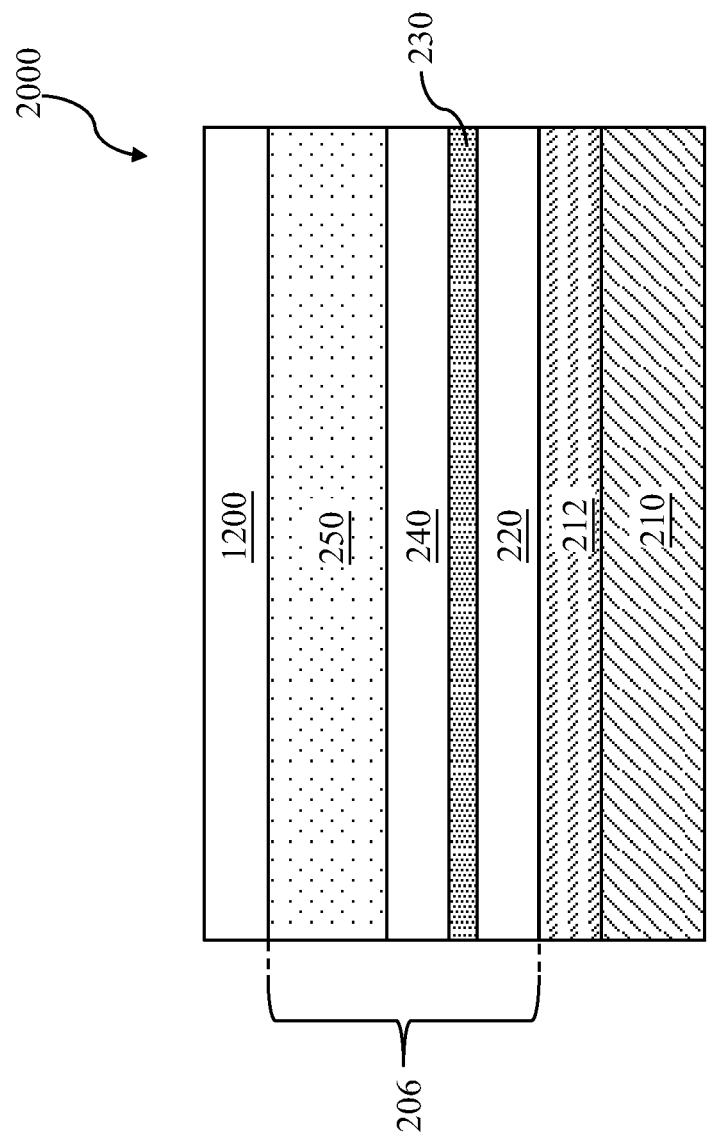
FIGS. 15, 16, 17, 18, 19, 20, 21, 22, 23, 24, 25, 26A and 26B are cross-sectional views of an exemplary MRAM cell in accordance with some embodiments.

Referring to FIGS. 14 and 15, the method 1000 proceeds to step 1004 by forming a first top electrode layer 1200 over the anti-ferromagnetic layer 250. The first top electrode layer 1200 is formed similarly in many respects with the top electrode layer 710 discussed above in association with FIG. 11. In one embodiment, the first electrode layer 1200 has a thickness ranging from about 10 nm to about 100 nm. In the present embodiment, the first top electrode layer is deposited over the anti-ferromagnetic layer 250, which has not been exposed to subsequent etch processes yet. Thus, the anti-ferromagnetic layer 250 avoids etch process-induced surface roughness and, as such, MRAM cell 2000 experiences improved adhesion between the anti-ferromagnetic layer 250 and the first top electrode layer 1200.

Figure 16:
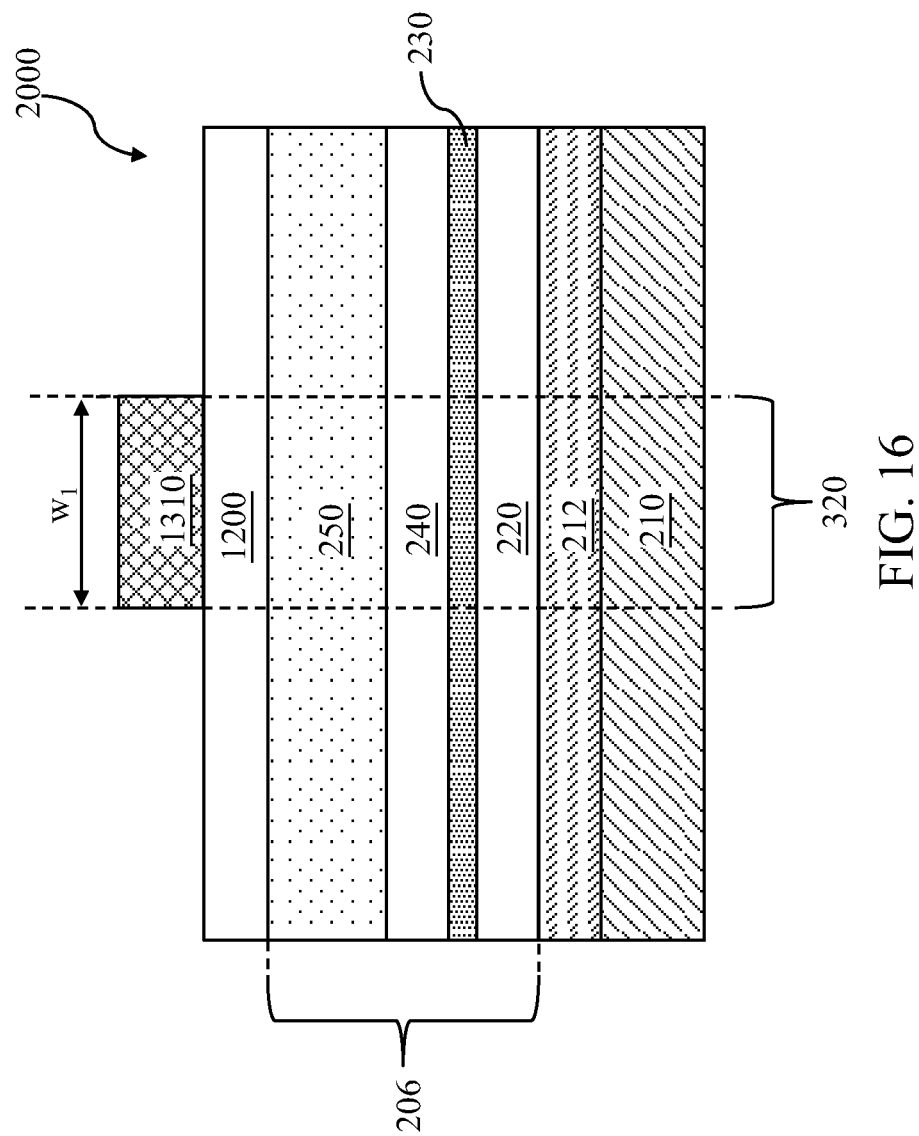

Referring to FIGS. 14 and 16, the method 1000 proceeds to step 1006 by forming the first patterned HM 1310 over the first top electrode layer 1200 to define the MTJ region 320 having a first width $w_1$. The first patterned HM 1310 is formed similarly in many respects with the first patterned HM layer 310 discussed above in association with FIG. 3.

Figure 17:
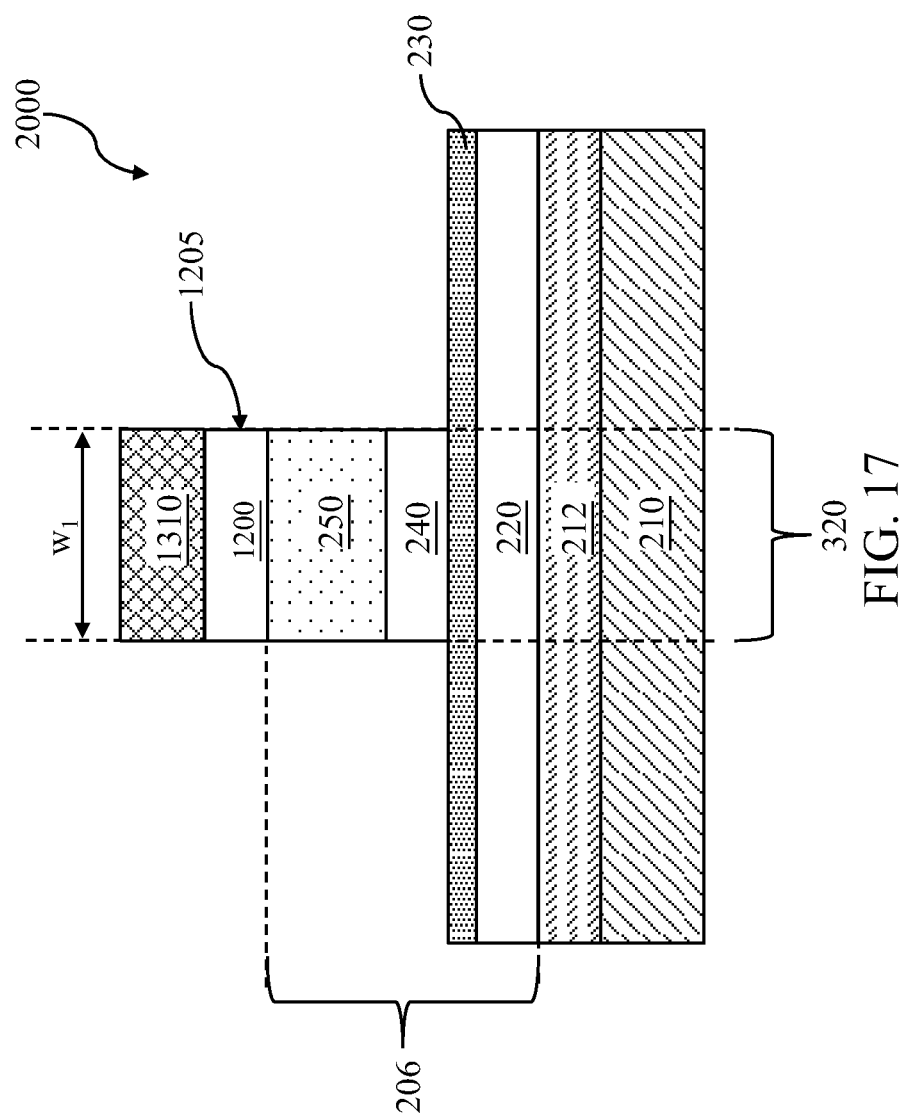

Referring to FIGS. 14 and 17, the method 1000 proceeds to step 1008 by performing a first etch process to etch the first top electrode layer 1200, the anti-ferromagnetic layer 250 and the pin layer 240 by using the first patterned HM layer 1310 as an etch mask. The first etch process is similar in many respects with the first etch process discussed above in association with FIG. 4. After the etch process, the remaining first top electrode layer 1200 forms a first top electrode 1205 and has a same width as the anti-ferromagnetic layer 250 and pin layer 240, namely first width $w_1$.

Figure 18:
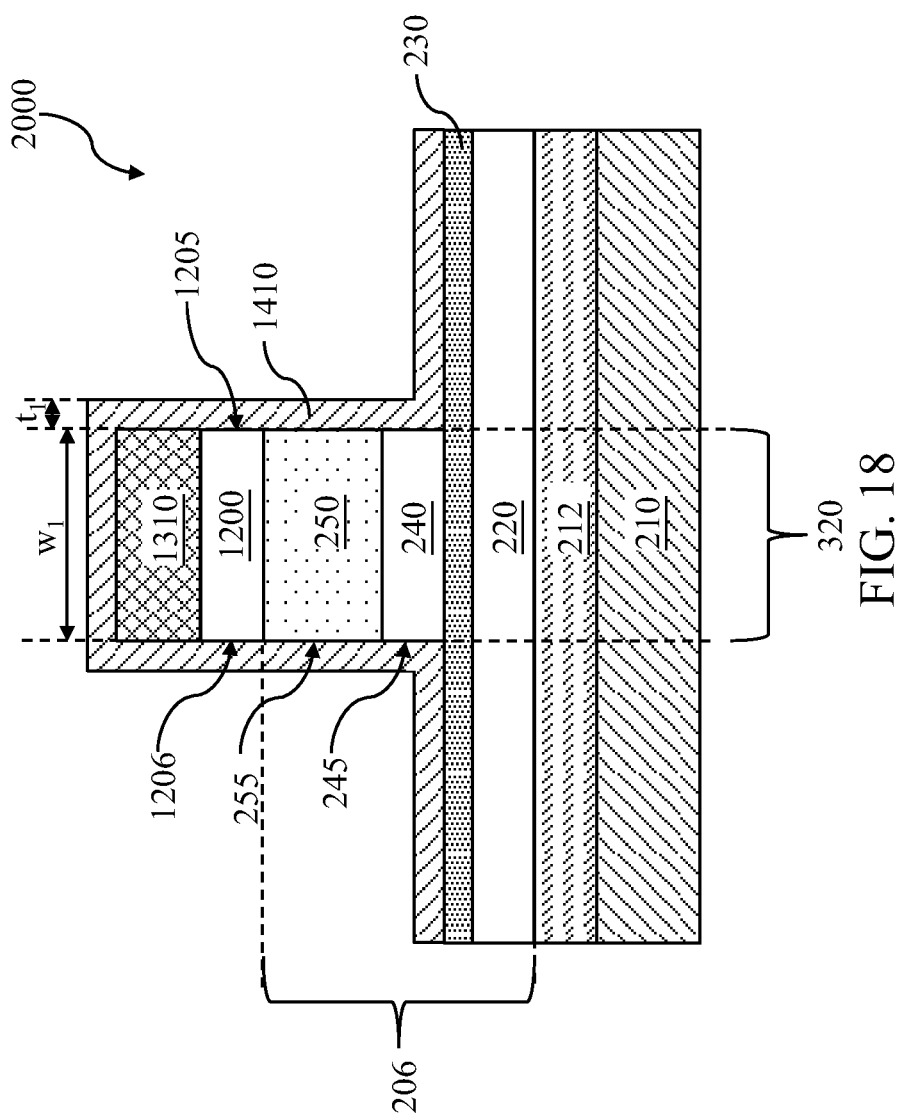

Referring to FIGS. 14 and 18, the method 1000 proceeds to step 1010 by forming a first capping layer 1410 over the first patterned HM layer 1310, including conformably extending along sidewalls 1206 of the first top electrode 1205, sidewalls 255 of the anti-ferromagnetic layer 250 and sidewalls 245 of the pin layer 240. The first capping layer 1410 is formed similarly in many respects with the first capping layer 410 discussed above in association with FIG. 5. In one embodiment, the first capping layer 1410 is formed with the first thickness $t_1$, ranging from about 10 nm to about 50 nm.

Figure 19:
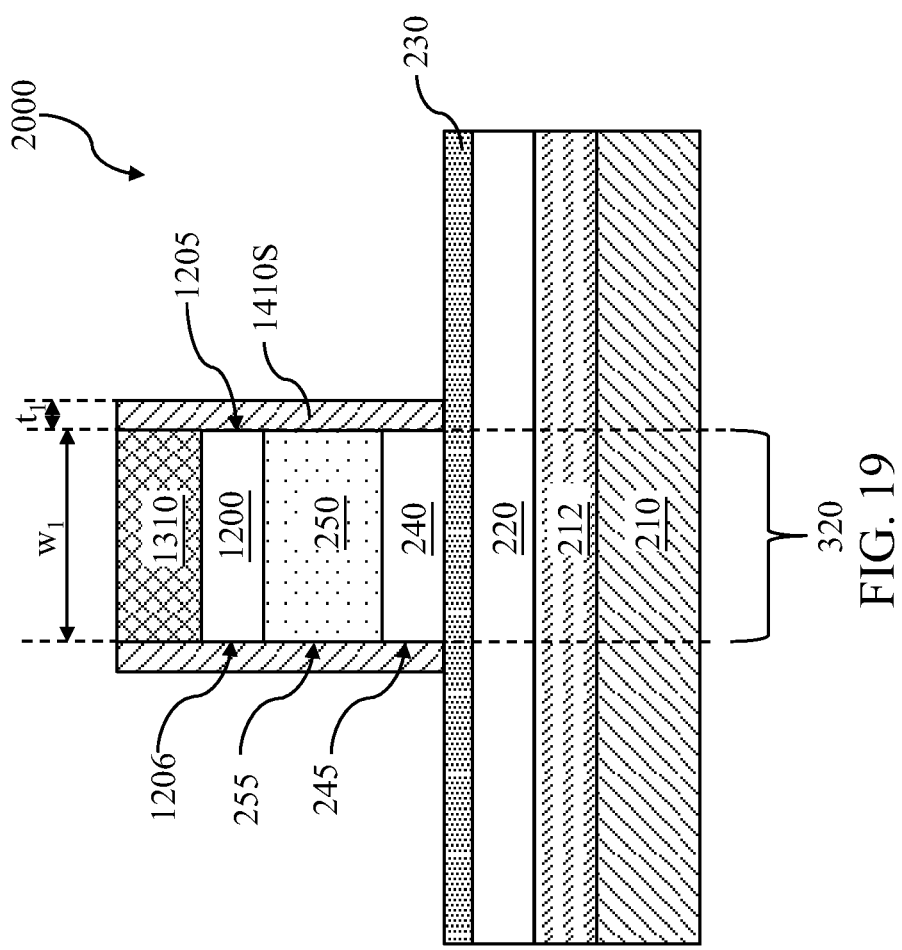

Referring to FIGS. 14 and 19, the method 1000 proceeds to step 1012 by performing a second etch process to remove the first capping layer 1410 over a top surface of the barrier layer 230 and over a top surface of the first patterned HM 1310 to expose the barrier layer 230 and the first patterned HM 1310. As shown, the first capping layer 1410 disposed along sidewalls of 245 and 255 remains and is referred to as a first sidewall-capping layer 1410S. The first capping layer 1410 is etched similarly in many respects with the first capping layer 410 is etched discussed above in association with FIG. 6.

Figure 20:
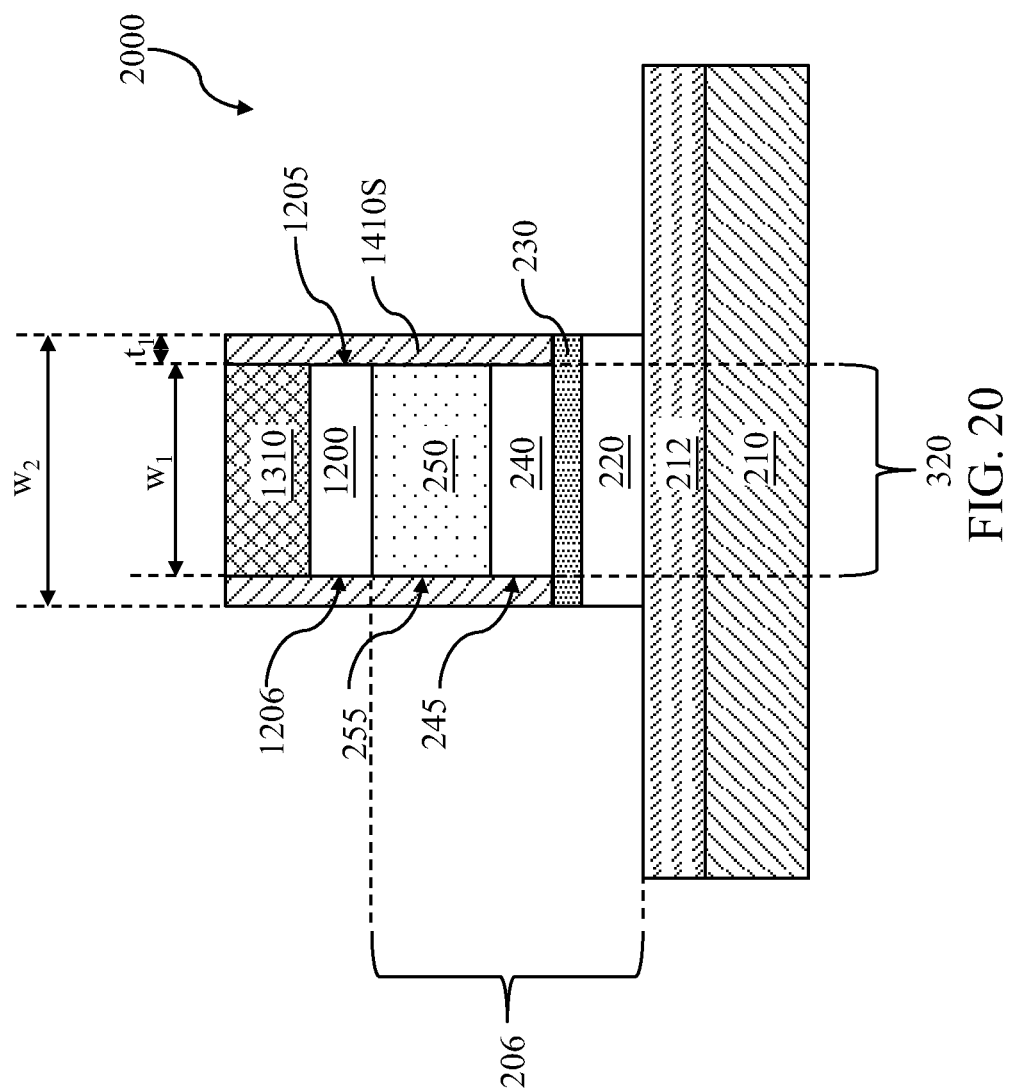

Referring to FIGS. 14 and 20, the method 1000 proceeds to step 1014 by performing a third etch process to etch the barrier layer 230 and free layer 220 by using the first patterned HM layer 1310 and the first sidewall-capping layer 1410S as an etch mask. Thus, the remaining free layer 220 has the second width $w_2$, which is wider than the first width $w_1$ of the remaining pin layer 240. The third etch process is similar in many respects with the third etch process discussed above in association with FIG. 7.

The third etch process is chosen to selectively etch the barrier layer 230 and the free layer 220 without substantially etching the first patterned HM 1310 and first sidewall-capping layer 1410S. Thus, the first sidewall-capping layer 1410S advantageously protects the sidewalls 255 of the etched anti-ferromagnetic layer 250 and sidewalls 245 of the pin layer 240 during the third etch process. This reduces the damage thereto and/or the re-deposition of by-product (such as polymer) on sidewalls 255 of the etched anti-ferromagnetic layer 250 and sidewalls 245 of the pin layer 240. As described above, such damage and/or re-deposition leads to increased leakage current and/or reduced data retention in a memory cell.

Figure 21:
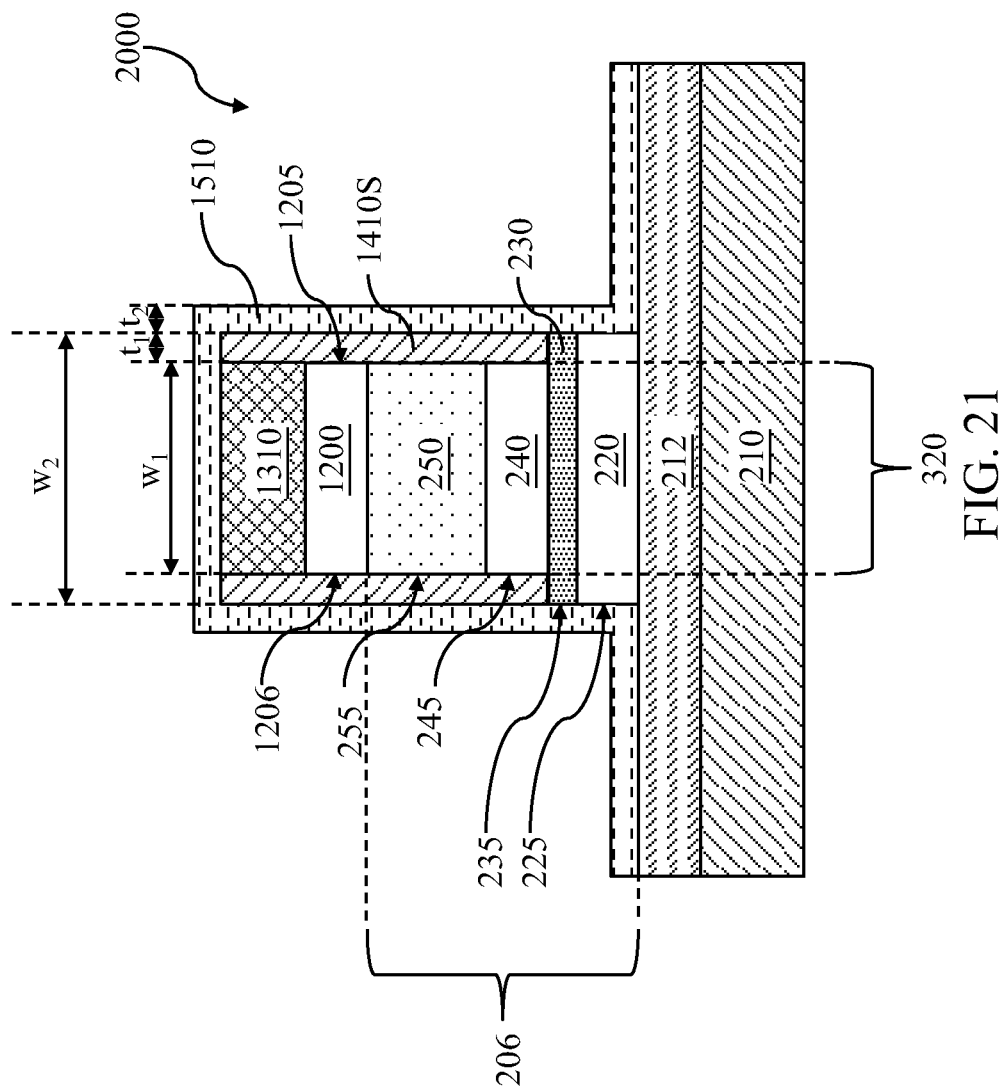

Referring to FIGS. 14 and 21, the method 1000 proceeds to step 1016 by forming a second capping layer 1510 over the first patterned HM 1310 and the first sidewall-capping layer 1410S, including conformably extending along sidewalls 225 of the free layer 220, as well as sidewalls of the barrier layer 230. The second capping layer 1510 is formed similarly in many respects with the second capping layer 510 discussed above in association with FIG. 8. In one embodiment, the second capping layer 1510 along sidewalls 225 is formed with the second thickness $t_2$ ranging from about 10 nm to about 50 nm to provide an adequate thickness to protect sidewalls 225 of the free layer 220 and sidewalls 235 of the barrier layer 230 during a subsequent etch process.

Figure 22:
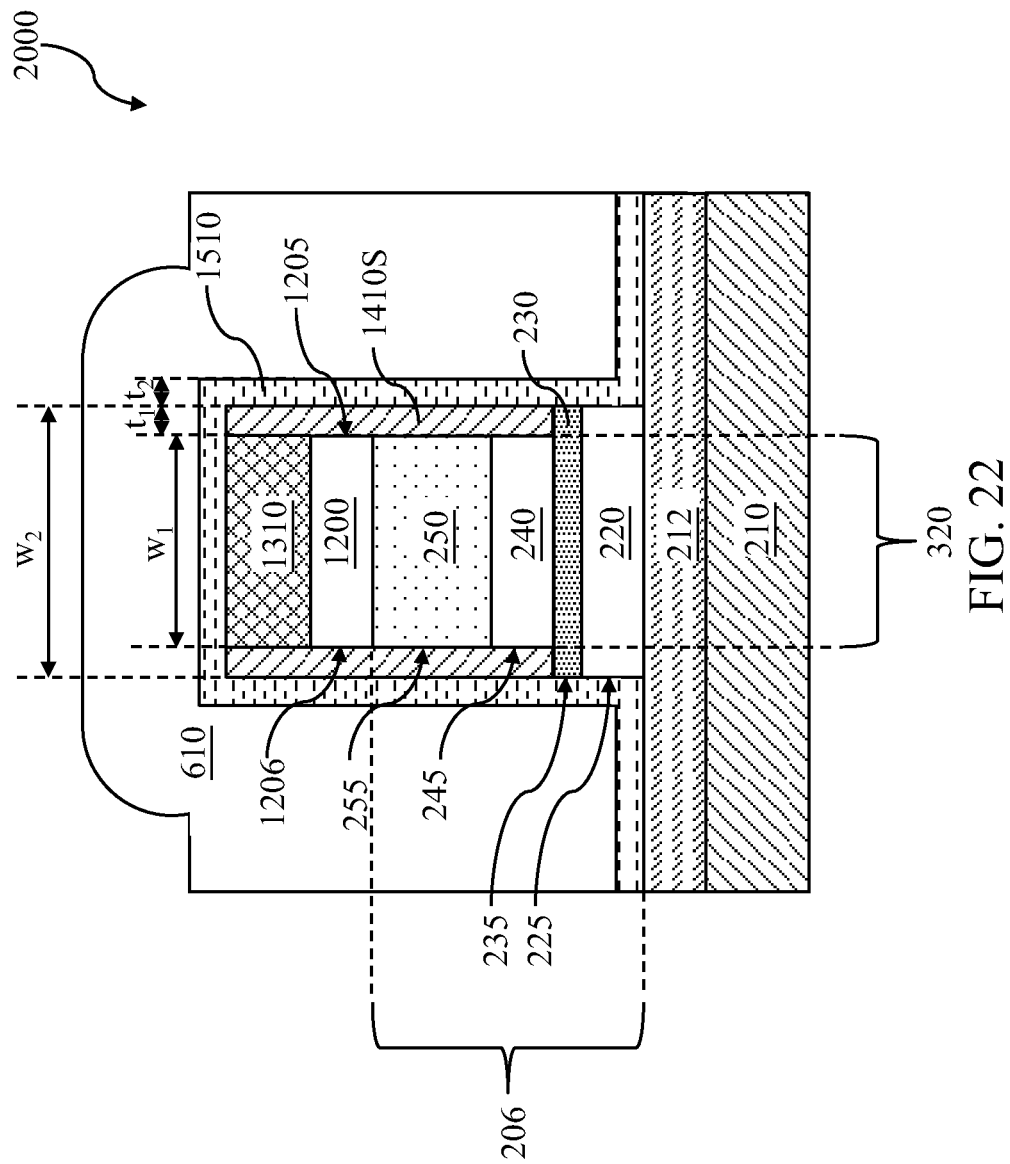

Referring to FIGS. 14 and 22, the method 1000 proceeds to step 1018 by depositing the first dielectric layer 610 over the second capping layer 1510 and filling up spaces outside the MTJ region 320. The first dielectric layer 610 is formed similarly in many respects with those discussed above in association with FIG. 9.

Figure 23:
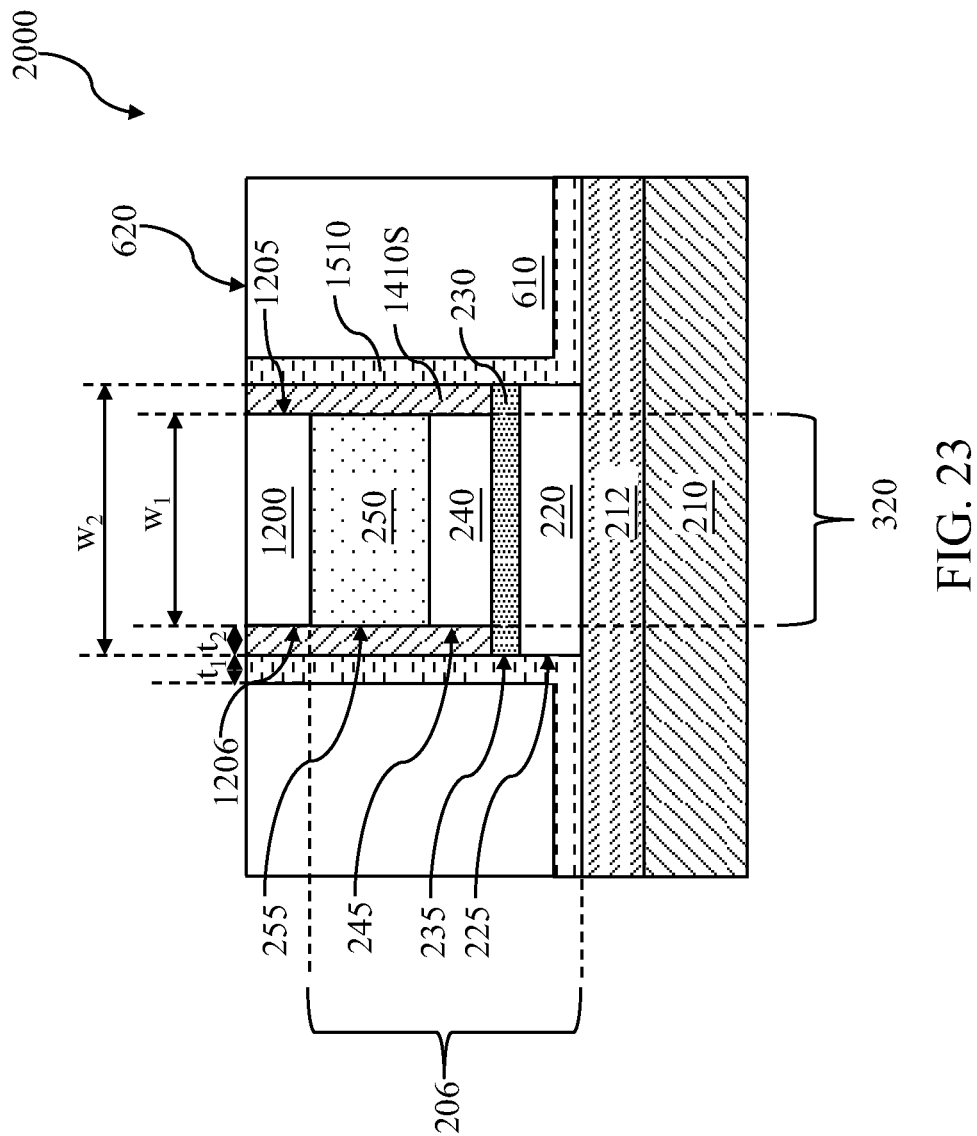

Referring to FIGS. 14 and 23, the method 1000 proceeds to step 1018 by recessing the first dielectric layer 610, the fourth capping layers 1510 disposed on top of the third patterned HM layer 1310 and the third patterned HM 1310 to expose a top surface of the first top electrode 1205. The first dielectric layer 610 is recessed similarly in many respects with those discussed above in association with FIG. 10. In the present embodiment, the recess process provides a planar topography (referred to as a surface 1620) for subsequent processes, such as a second top electrode layer deposition.

Figure 24:
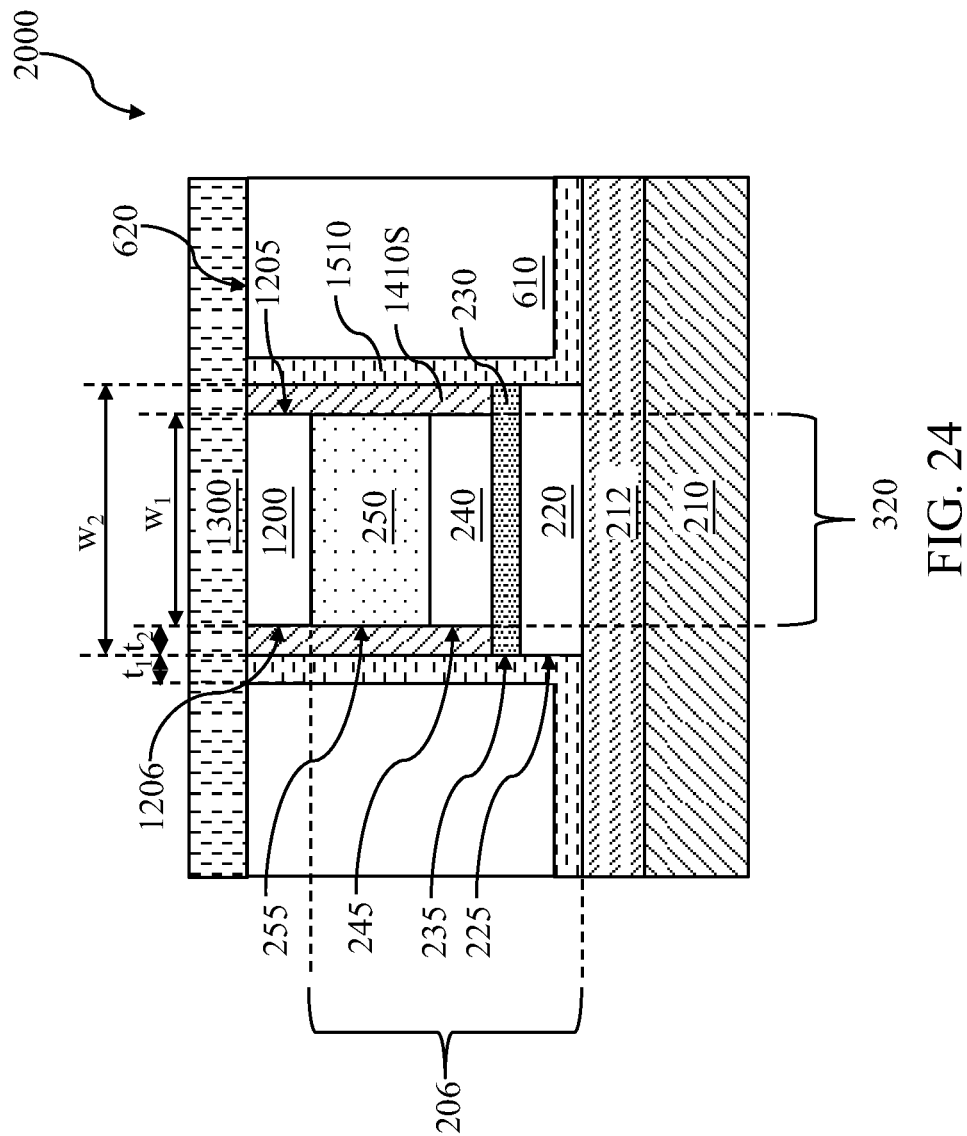

Referring to FIGS. 14 and 24, the method 1000 proceeds to step 1020 by forming a second top electrode layer 1300 over the surface 1620, including physical contacting with the first top electrode 1205. The second top electrode layer 1300 is formed similarly to the bottom electrode layer 212 discussed above in association with FIG. 2. In one embodiment, the second top electrode layer 1300 has a thickness ranging from about 10 nm to about 100 nm.

Figure 25:
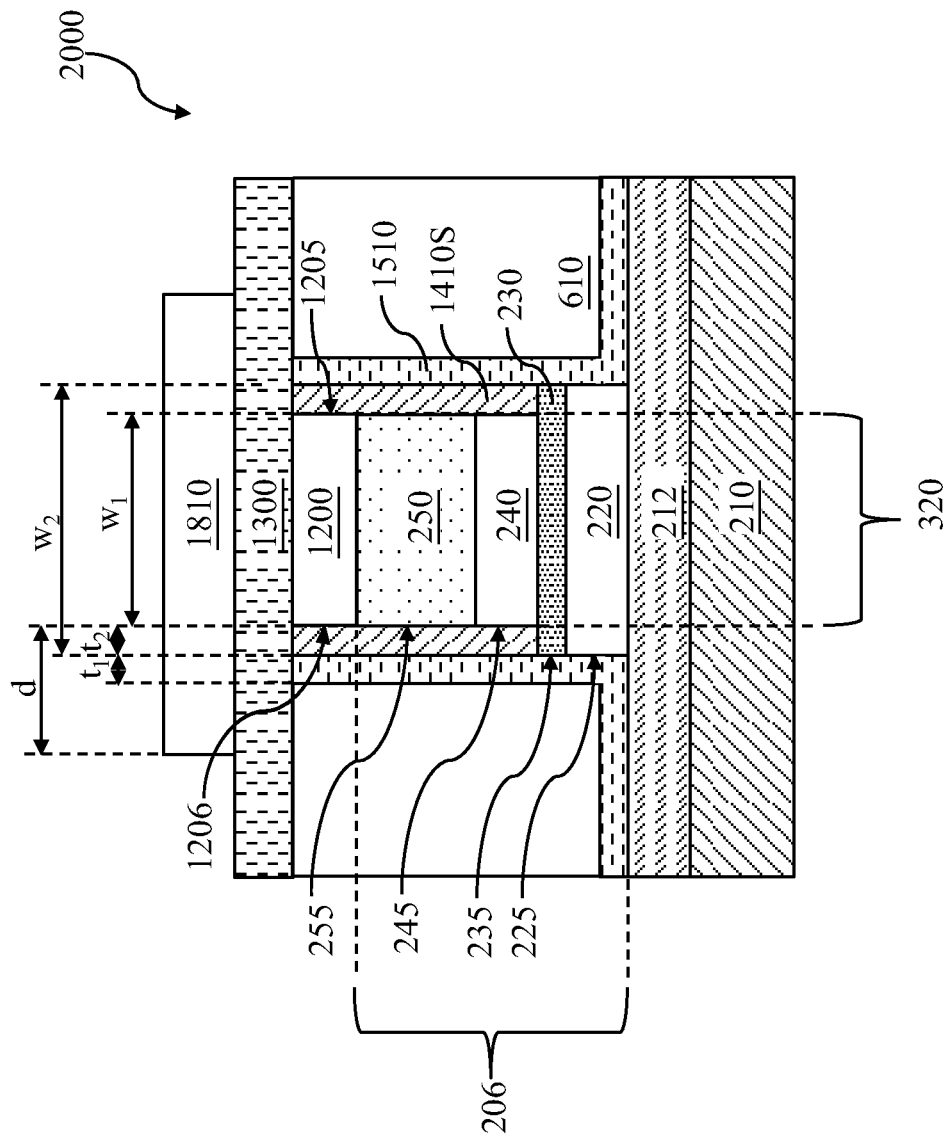

Referring to FIGS. 14 and 25, the method 1000 proceeds to step 1022 by forming a fourth pattern HM 1810 over the second top electrode layer 1300. The fourth patterned HM layer 1810 defines (covers) a width of a second top electrode to be formed. In the present embodiment, an edge of the second pattern HM 1810 extends laterally (or horizontally) beyond the first top electrode 1205 by the distance d. In one embodiment, the distance d ranges from about 10 nm to about 170 nm. The second patterned HM 1810 similarly in many respects with the second patterned HM 810 discussed above in association with FIG. 12.

Figure 26A:
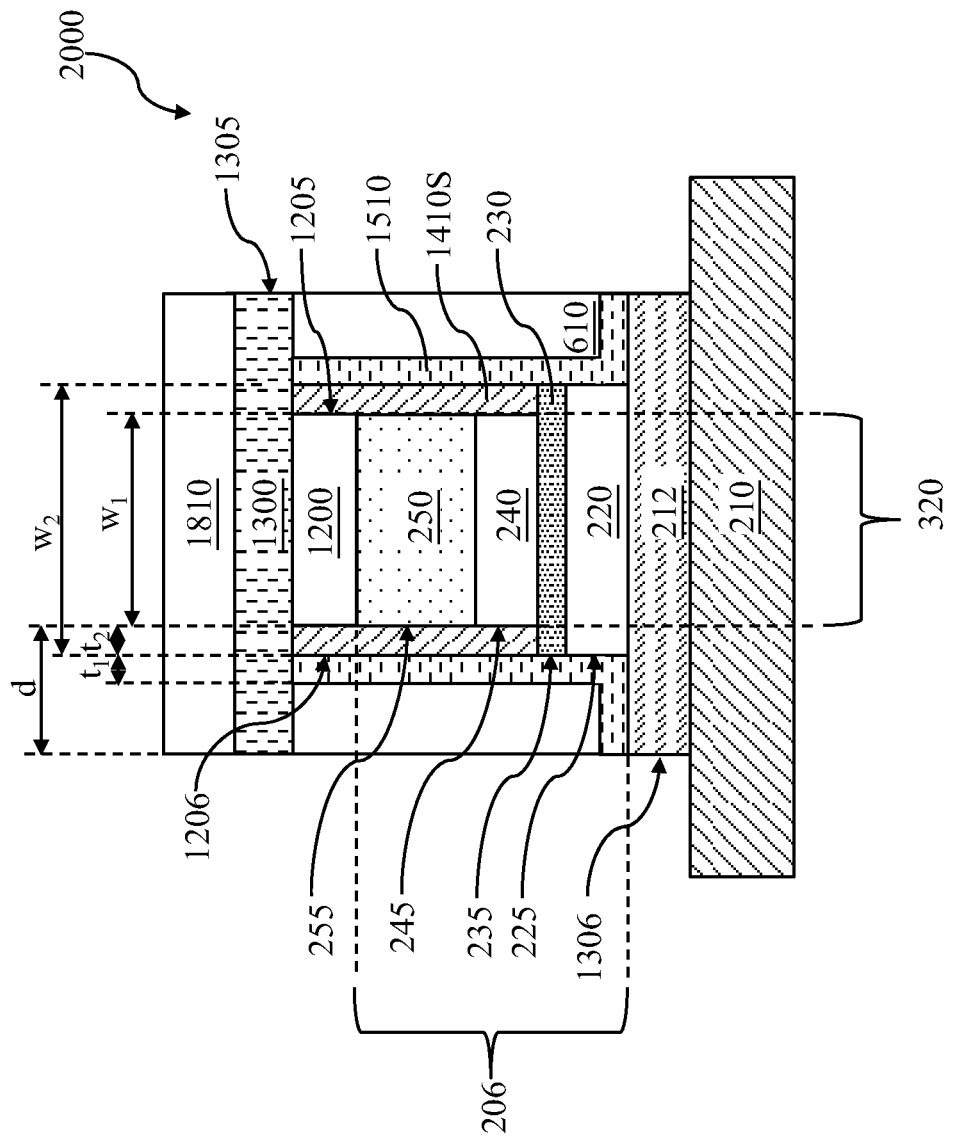

Referring to FIGS. 14 and 26A, the method 1000 proceeds to step 1024 by performing a fourth etch process, using the second patterned HM 1810 as an etch mask, to etch the second top electrode layer 1300 and the bottom electrode layer 212 to form a second top electrode 1305 and the bottom electrode 716, respectively. The first dielectric layer 610, the second capping layer 1510 over the bottom electrode layer 212 are etched as well. The fourth etch process is similar in many respects with the fourth etch process discussed above in association with FIG. 13A. During the fourth etch process, sidewalls 225 are protected by the second capping layer 1510 and sidewalls 245 and 255 are protected by the second capping layer 1510 and the first sidewall-capping layer 1410S. Thus, sidewalls of 225, 235, 245 and 255 advantageously avoid being exposed in the fourth etch process which reduces the likelihood of damage, and/or the re-deposition of by-product (such as polymer) on them. As described above, such damage and/or re-deposition leads to increased leakage current and/or reduced data retention in a memory cell.

Figure 26B:
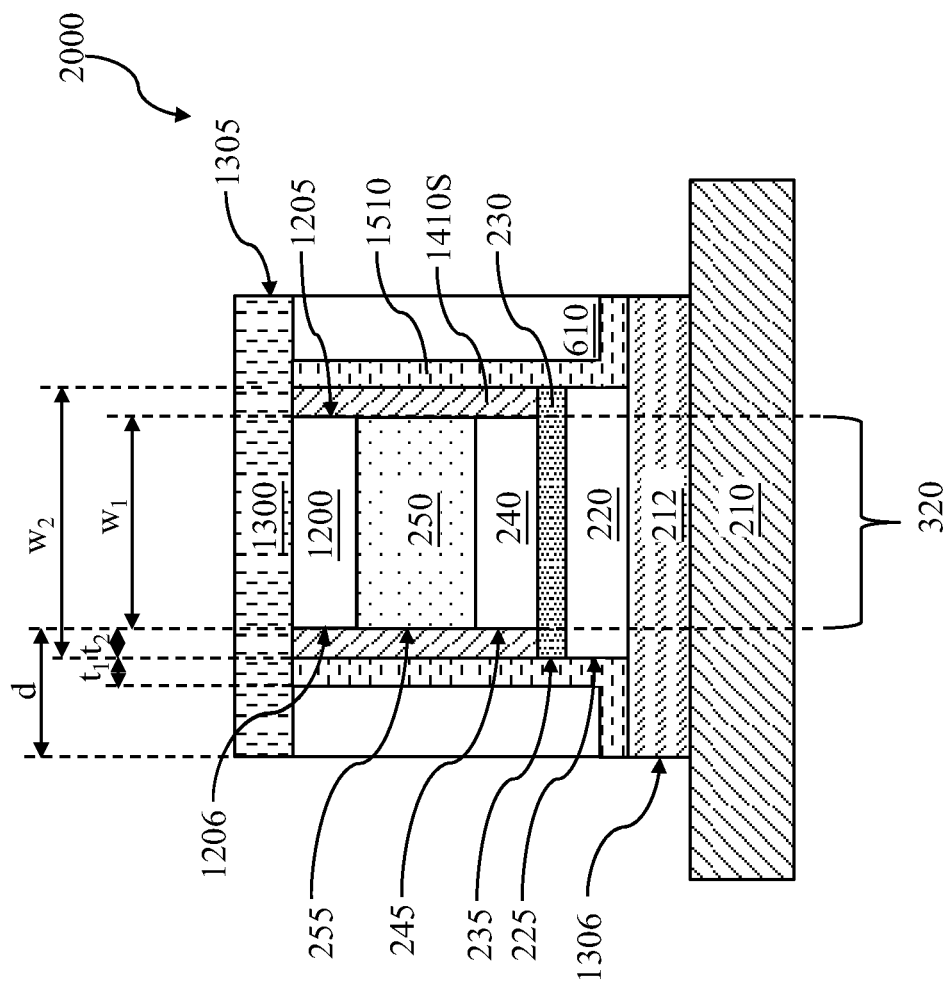

After the fourth etch process, the second patterned HM 1810 is removed by an etch process, as shown in FIG. 26B. In the present embodiment, the MRAM cell 2000 includes the bottom electrode 1306, the free layer 220 disposed over the bottom electrode 1306 and a barrier layer 230 disposed over the free layer 220. The free layer 220 and the barrier layer 230 have a same width, namely the second width $w_2$. The MRAM cell 2000 also includes the pin layer 240 disposed over the barrier layer 230, the anti-ferromagnetic layer 250 disposed over the pin layer 240 and the first top electrode 1205 disposed over the anti-ferromagnetic layer 250. The pin layer 240, the anti-ferromagnetic layer 250 and the first top electrode 1205 have a same width, namely the first width $w_1$.

The MRAM cell 2000 also includes the first sidewall-capping layer 1410S extending along sidewalls of the sidewalls 1206 of the first top electrode 1205, sidewalls 255 of the anti-ferromagnetic layer 250 and sidewalls 245 of the pin layer 240. The second capping layer 1510 is disposed over the first sidewall-capping layer 1410S and continues to extend along sidewalls 235 of the barrier layer 230 and sidewalls 225 of the free layer 220. Furthermore, the second top electrode 1305 is disposed over the first top electrode 1205 such that the second top electrode 1205 horizontally (or laterally) extends beyond the first top electrode 1205 by the distance d. The bottom electrode 1206 has a same width as the second top electrode 1305.

Additional steps can be provided before, during, and after methods of 100, and/or 1000, and some of the steps described can be replaced, eliminated, or moved around for additional embodiments of the methods of 100 and/or 1000. The MRAM cells 200 and 2000 may include additional features, which may be formed by subsequent processing.

Figures 27A, 27B, 27C:
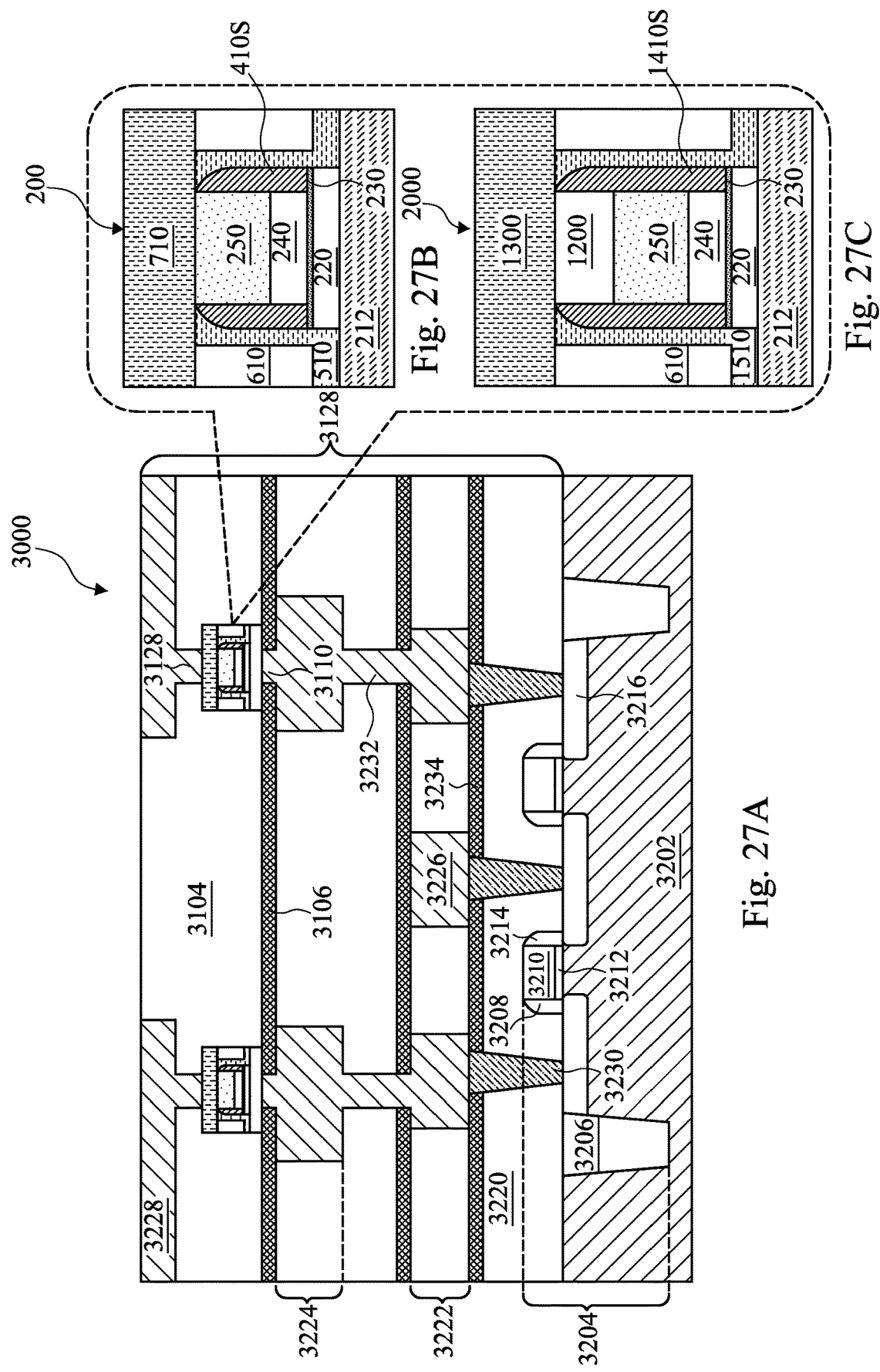
FIG. 27A is a cross-sectional view of some embodiments of an integrated circuit including a MRAM cell.
FIGS. 27B and 27C are cross-sectional views of some embodiments of a semiconductor structure including a MRAM cell.

With reference to FIGS. 27A-27C, a cross-sectional view of some embodiments of an integrated circuit 3000 is provided. The integrated circuit 3000 includes a semiconductor substrate 3202 over and/or within which a device layer 3204 is arranged. The semiconductor substrate 3202 may be, for example, a bulk substrate (e.g., a bulk silicon substrate) or a silicon-on-insulator (SOI) substrate. The device layer 3204 includes one or more shallower trench isolation (STI) region 3206 and two word line transistors 3208 spaced between the STI regions 3206. The STI regions 3206 may be, or otherwise include, an oxide-filled trench within the semiconductor substrate 3202.

The word line transistors 3208 extend parallel to each other, and include word line gates 3210, word line dielectric layers 3212, word line sidewall spacer layers 3214, and source/drain regions 3216. The word line gates 3210 are arranged over corresponding word line dielectric layers 3212, and lined by corresponding word line sidewall spacer layers 3214. The source/drain regions 3216 are embedded within the surface of the semiconductor substrate 3202 between the word line gates 3210 and the STI regions 3206. The word line gates 3210 may be, for example, doped polysilicon or a metal, such as titanium nitride or tantalum nitride. The word line dielectric layers 3212 may be, for example, an oxide, such as silicon dioxide. The word line sidewall spacer layers 3214 may be, for example, silicon nitride. The source/drain regions 3216 correspond to, for example, doped regions of the semiconductor substrate 3202.

A back-end-of-line (BEOL) metallization stack 3218 is arranged over the device layer 3204. The BEOL metallization stack 3218 includes a plurality of ILD layers 3104, 3220, a pair of MRAM cells 200 (or 2000) and a plurality of metallization layers 3222, 3224. The MRAM cells 200 (or 2000) are as described with FIG. 27B (or FIG. 27C) and are arranged within the ILD layers 3104, 3220. The metallization layers 3222, 3224 include metal lines 3226, 3228 and are also arranged within the ILD layers 3104, 3220. The metal lines 3226, 3228 include a source line 3226 arranged parallel to and between the word line transistors 3208. Further, the metal lines 3226, 3228 include bit lines 3228 corresponding to the MRAM cells 200 (or 2000) that extend parallel to each other and laterally perpendicular to the word line transistors 3208. The ILD layers 3104, 3220 may be, for example, a low κ dielectric, such as undoped silicate glass, or an oxide, such as silicon dioxide. In some embodiments, the ILD layer 3220 immediately over the device layer 3204 is an oxide and the other ILD layers 3104 are a low κ dielectric. The metallization layers 3222, 3224 may be, for example, a metal, such as copper or aluminum.

Contacts 3230 extend from the metallization layer 3222 immediately overlying the device layer 3204 to the device layer 3204, and vias 3110, 3128, 3232 extend between the metallization layers 3222, 3224 and the MRAM cells 200 (or 2000). The contacts 3230 and the vias 3110, 3128, 3232 extend through etch stop layers 3106, 3234 arranged between the ILD layers 3104, 3220 and the metallization layers 3222, 3224. In some embodiments, the contacts 3230 and the vias 3110, 3128, 3232 have different shapes. For example, the contacts 3230 may have tapering widths, whereas the vias 3110, 3128, 3232 may have uniform widths. The etch stop layers 3106, 3234 may be, for example, silicon nitride. The contacts 3230 and the vias 3110, 3128, 3232 may be, for example, a metal, such as copper, gold, or tungsten.

Based on the above, it can be seen that the present disclosure provide methods of forming a MRAM cell. The method employs using sidewall-capping layers to protect sidewalls of pin layer and free layer to avoid-induced damage and polymer re-deposition during multiple etch processes. The method also employs forming a portion of the top electrode layer over the AFL before the AFL receives an etch process, which avoids etch process-induced surface roughness and, as such, MRAM cell experiences improved adhesion between the AFL and the top electrode layer. The method demonstrates reduction of leakage current and/or data retention in a memory cell.

The present disclosure provides many different embodiments of fabricating a semiconductor device that provide one or more improvements over existing approaches. In one embodiment, a method for fabricating a semiconductor device includes forming a stack of film comprising an anti-ferromagnetic layer disposed over a pin layer, the pin layer disposed over a barrier layer, the barrier layer disposed over a free layer and the free layer disposed over a bottom electrode layer. The method also includes forming a first patterned hard mask over the anti-ferromagnetic layer, etching the anti-ferromagnetic layer and the pin layer by using the first patterned hard mask as a first etch mask, forming a first capping layer along sidewalls of the anti-ferromagnetic layer and the pin layer, etching the barrier layer and the free layer by using first patterned hard mask and the first capping layer as a second etch mask, forming a second capping layer over the first capping layer and extending along sidewalls of the barrier layer and the free layer, exposing the anti-ferromagnetic layer and forming a top electrode layer over the exposed anti-ferromagnetic layer.

In yet another embodiment, a method includes forming a stack of film comprising an anti-ferromagnetic layer disposed over a pin layer, the pin layer disposed over a barrier layer, the barrier layer disposed over a free layer and the free layer disposed over a bottom electrode layer. The method also includes forming a first top electrode layer over the anti-ferromagnetic layer, forming a first patterned hard mask over the first top electrode layer, etching the first top electrode layer, the anti-ferromagnetic layer and the pin layer by using the first patterned HM as a first etch mask, forming a first capping layer extending along sidewalls of the first top electrode layer, sidewalls of the anti-ferromagnetic layer and sidewalls of the pin layer, etching the barrier layer and the free layer by using first patterned HM and the first capping layer as a second etch mask, forming a second capping layer over the first capping layer and extending along sidewalls of the barrier layer and sidewalls of the free layer, exposing the first top electrode layer and forming a second top electrode layer over the exposed first top electrode layer.

In yet another embodiment, a magnetoresistive random-access memory (MRAM) cell includes a free layer having a variable magnetic polarity, wherein the free layer has a first width. The MRAM cell also includes a barrier layer disposed over the free layer, wherein the barrier layer has the first width. The MRAM cell also includes a pin layer having a fixed magnetic polarity disposed over the free layer, wherein the pin layer has a second width, which is less than the first width. The MRAM cell also includes an anti-ferromagnetic layer (AFL) disposed over the pin layer, wherein the anti-ferromagnetic layer has the second width. The MRAM cell also includes a first capping layer extending from the AFL along sidewalls of it to sidewalls of the pin layer, wherein an edge of the first capping layer aligns with an edge of the free layer. The MRAM cell also includes a second capping layer disposed over the first capping layer and extending along sidewalls of the free layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a magnetoresistive random-access memory (MRAM) cell comprising:
   forming a free layer having a variable magnetic polarity, wherein the free layer has a first width;
   disposing a barrier layer over the free layer, wherein the barrier layer has the first width;
   disposing a pin layer having a fixed magnetic polarity over the free layer, wherein the pin layer has a second width, which is less than the first width;
   disposing an anti-ferromagnetic layer (AFL) over the pin layer, wherein the anti-ferromagnetic layer has the second width;
   forming a first capping layer extending from the AFL along sidewalls of the AFL to sidewalls of the pin layer, wherein an outer edge of the first capping layer aligns with an outer edge of the free layer, wherein the first capping layer is conformal to both sidewalls of the AFL and the pin layer;
   disposing a second capping layer over the first capping layer and extending along sidewalls of the free layer, wherein the second capping layer fully covers the first capping layer; and
   recessing the first capping layer and the second capping layer to expose a portion of the AFL.

2. The method of claim 1, further including:
   forming a top electrode disposed over the AFL, wherein the top electrode has a third width, which is longer than the second width; and
   forming a bottom electrode disposed under the free layer, wherein the bottom electrode has the third width.

3. A method comprising:
   forming a stack of film comprising an anti-ferromagnetic layer disposed over a pin layer, the pin layer disposed over a barrier layer, the barrier layer disposed over a free layer and the free layer disposed over a bottom electrode layer;
   forming a first patterned hard mask over the anti-ferromagnetic layer;
   etching the anti-ferromagnetic layer and the pin layer by using the first patterned hard mask as a first etch mask;
   forming a first capping layer extending along sidewalls of the anti-ferromagnetic layer and sidewalls of the pin layer;
   etching the barrier layer and the free layer by using the first patterned hard mask and the first capping layer as a second etch mask;
   forming a second capping layer over the first patterned hard mask, the first capping layer, the barrier layer, and the free layer;
   depositing a dielectric layer over the second capping layer;
   recessing the dielectric layer, the second capping layer, the first capping layer, and the first patterned hard mask to expose the anti-ferromagnetic layer; and
   forming a top electrode layer over the exposed anti-ferromagnetic layer.

4. The method of claim 3, wherein the recessing of the dielectric layer, the second capping layer, the first capping layer, and the first patterned hard mask to expose the anti-ferromagnetic layer includes a chemical mechanical polishing process.

5. The method of claim 3, wherein the pin layer includes a ferromagnetic material.

6. The method of claim 3, wherein the free layer includes a ferromagnetic material.

7. The method of claim 3, wherein the barrier layer serves as an etch-stop layer during the etching of the anti-ferromagnetic layer and the pin layer.

8. The method of claim 3, wherein the dielectric layer is deposited over a horizontal portion of the second capping layer in physical contact with the bottom electrode layer.

9. The method of claim 3, wherein the anti-ferromagnetic layer includes platinum manganese (PtMn), iridium manganese (IrMn), rhodium manganese (RhMn), or iron manganese (FeMn).

10. The method of claim 3, further comprising:
forming a second patterned hard mask over the top electrode layer; and
etching the top electrode layer and the bottom electrode layer by using the second patterned hard mask as a third etch mask.

11. The method of claim 10, wherein the second patterned hard mask is wider than the first patterned hard mask.

12. A method comprising:
forming a stack of film comprising an anti-ferromagnetic layer disposed over a pin layer, the pin layer disposed over a barrier layer, the barrier layer disposed over a free layer and the free layer disposed over a bottom electrode layer;
forming a first patterned hard mask over the anti-ferromagnetic layer;
etching the anti-ferromagnetic layer and the pin layer by using the first patterned hard mask as a first etch mask;
forming a first capping layer along sidewalls of the anti-ferromagnetic layer and the pin layer;
etching the barrier layer and the free layer by using the first patterned hard mask and the first capping layer as a second etch mask;
forming a second capping layer over the first capping layer and extending along sidewalls of the barrier layer and the free layer;
exposing the anti-ferromagnetic layer; and
forming a top electrode layer over the exposed anti-ferromagnetic layer.

13. The method of claim 12, further comprising:
forming a second patterned hard mask over the top electrode layer; and
etching the top electrode layer and bottom electrode layer by using the second patterned hard mask as a third etch mask while the second capping layer protects sidewalls of the stack of films.

14. The method of claim 12, wherein the barrier layer serves as an etch-stop layer during etching the anti-ferromagnetic layer and the pin layer.

15. The method of claim 12, wherein forming the first capping layer along sidewalls of the anti-ferromagnetic layer and the pin layer includes:
depositing the first capping layer over the first patterned hard mask, along sidewalls of the anti-ferromagnetic layer and the pin layer and over a top surface of the barrier layer; and
removing the first capping layer over the first patterned hard mask and over the top surface of the barrier layer while the first capping layer remains along sidewalls of the anti-ferromagnetic layer and the pin layer.

16. The method of claim 12, wherein forming a stack of film comprising an anti-ferromagnetic layer disposed over a pin layer, the pin layer disposed over a barrier layer, the barrier layer disposed over a free layer and the free layer disposed over a bottom electrode layer, includes depositing the pin layer with a ferromagnetic material.

17. The method of claim 12, wherein forming a stack of film comprising an anti-ferromagnetic layer disposed over a pin layer, the pin layer disposed over a barrier layer, the barrier layer disposed over a free layer and the free layer disposed over a bottom electrode layer, includes depositing the free layer with a ferromagnetic material.

18. The method of claim 12, wherein exposing the anti-ferromagnetic layer includes:
removing the second capping layer disposed over the first patterned hard mask; and
applying a chemical mechanical polishing process to remove the first patterned hard mask disposed over the anti-ferromagnetic layer.

19. The method of claim 18, further comprising: depositing a dielectric layer over and around the second capping layer before the removing of the second capping layer disposed over the first patterned hard mask.

20. The method of claim 19, wherein exposing the anti-ferromagnetic layer includes recessing the dielectric layer to expose the anti-ferromagnetic layer.

* * * * *